United States Patent
Yamazaki et al.

(10) Patent No.: US 7,566,010 B2
(45) Date of Patent: Jul. 28, 2009

(54) SECURITIES, CHIP MOUNTING PRODUCT, AND MANUFACTURING METHOD THEREOF

(75) Inventors: Shunpei Yamazaki, Setagaya (JP); Kiyoshi Kato, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 489 days.

(21) Appl. No.: 11/018,151

(22) Filed: Dec. 22, 2004

(65) Prior Publication Data

US 2005/0146006 A1 Jul. 7, 2005

(30) Foreign Application Priority Data

Dec. 26, 2003 (JP) ............................. 2003-432343
Feb. 6, 2004 (JP) ............................. 2004-030976

(51) Int. Cl.
*G06K 19/06* (2006.01)

(52) U.S. Cl. ...................... 235/492; 235/380

(58) Field of Classification Search ............... 235/492, 235/380, 451, 486; 257/679, 895; 343/895
See application file for complete search history.

(56) References Cited

U.S. PATENT DOCUMENTS

| 5,206,749 A | 4/1993 | Zavracky et al. |
| 5,317,236 A | 5/1994 | Zavracky et al. |
| 5,376,561 A | 12/1994 | Vu et al. |
| 5,378,536 A | 1/1995 | Miller et al. |
| 5,389,438 A | 2/1995 | Miller et al. |
| 5,541,399 A | 7/1996 | De Vall |
| 5,757,456 A | 5/1998 | Yamazaki et al. |
| 5,804,484 A | 9/1998 | Wen |
| 5,821,138 A | 10/1998 | Yamazaki et al. |
| 5,834,327 A | 11/1998 | Yamazaki et al. |
| 5,888,858 A | 3/1999 | Yamazaki et al. |
| 5,973,598 A | 10/1999 | Beigel |
| 5,985,740 A | 11/1999 | Yamazaki et al. |

(Continued)

FOREIGN PATENT DOCUMENTS

EP 0443263 8/1991

(Continued)

OTHER PUBLICATIONS

"Sense of Crisis is a Trigger. Ignited Evolution of a Sesame-Grain Sized Chip Technology Development is Entering Into the Second Phase,", Nikkei Electronics, Nov. 18, 2002, No. 835, pp. 67-76.

(Continued)

*Primary Examiner*—Karl D. Frech
(74) *Attorney, Agent, or Firm*—Eric J. Robinson; Robinson Intellectual Property Law Office, P.C.

(57) ABSTRACT

The invention provides an ID chip with reduced cost, increased impact resistance and attractive design, as well as products and the like mounting the ID chip and a manufacturing method thereof. In view of the foregoing, an integrated circuit having a semiconductor film with a thickness of 0.2 μm or less is mounted on securities including bills, belongings, containers of food and drink, and the like (hereinafter referred to as products and the like). The ID chip of the invention can be reduced in cost and increased in impact resistance as compared with a chip formed over a silicon wafer while maintaining an attractive design.

22 Claims, 26 Drawing Sheets

U.S. PATENT DOCUMENTS

| | | | |
|---|---|---|---|
| 6,043,800 A | 3/2000 | Spitzer et al. | |
| 6,063,654 A | 5/2000 | Ohtani | |
| 6,087,730 A * | 7/2000 | McGarvey et al. | 257/766 |
| 6,100,562 A | 8/2000 | Yamazaki et al. | |
| 6,118,502 A | 9/2000 | Yamazaki et al. | |
| 6,127,199 A | 10/2000 | Inoue et al. | |
| 6,165,824 A | 12/2000 | Takano et al. | |
| 6,168,829 B1 | 1/2001 | Russ et al. | |
| 6,180,439 B1 | 1/2001 | Yamazaki et al. | |
| 6,348,368 B1 | 2/2002 | Yamazaki et al. | |
| 6,376,333 B1 | 4/2002 | Yamazaki et al. | |
| 6,424,011 B1 | 7/2002 | Assaderaghi et al. | |
| 6,440,773 B1 * | 8/2002 | Usami | 438/107 |
| 6,445,450 B1 * | 9/2002 | Matsumoto | 356/401 |
| 6,465,287 B1 | 10/2002 | Yamazaki et al. | |
| 6,479,333 B1 | 11/2002 | Takano et al. | |
| 6,521,511 B1 | 2/2003 | Inoue et al. | |
| 6,627,518 B1 | 9/2003 | Inoue et al. | |
| 6,700,631 B1 | 3/2004 | Inoue et al. | |
| 6,778,233 B2 | 8/2004 | Matsuura et al. | |
| 6,781,152 B2 | 8/2004 | Yamazaki | |
| 6,814,832 B2 | 11/2004 | Utsunomiya | |
| 6,821,553 B2 | 11/2004 | Miyashita et al. | |
| 6,825,072 B2 | 11/2004 | Yamazaki et al. | |
| 6,858,518 B2 | 2/2005 | Kondo | |
| 6,871,339 B2 | 3/2005 | Hasei | |
| 6,873,033 B2 | 3/2005 | Kawai et al. | |
| 6,887,650 B2 | 5/2005 | Shimoda et al. | |
| 6,893,503 B1 | 5/2005 | Ohnuma et al. | |
| 6,911,358 B2 | 6/2005 | Azami et al. | |
| 7,045,438 B2 | 5/2006 | Yamazaki et al. | |
| 7,056,381 B1 | 6/2006 | Yamazaki et al. | |
| 7,060,153 B2 | 6/2006 | Yamazaki et al. | |
| 7,091,070 B2 | 8/2006 | Imai et al. | |
| 7,122,445 B2 | 10/2006 | Takayama et al. | |
| 7,129,145 B2 | 10/2006 | Kawamura et al. | |
| 7,131,194 B2 | 11/2006 | Hashimoto | |
| 7,159,241 B1 | 1/2007 | Horiguchi et al. | |
| 7,166,500 B2 | 1/2007 | Yamazaki et al. | |
| 7,244,662 B2 | 7/2007 | Kondo | |
| 7,271,076 B2 | 9/2007 | Yamazaki et al. | |
| 2001/0015256 A1 | 8/2001 | Yamazaki et al. | |
| 2001/0053559 A1 | 12/2001 | Nagao et al. | |
| 2002/0093012 A1 * | 7/2002 | Shimoji | 257/10 |
| 2003/0006121 A1 | 1/2003 | Lee et al. | |
| 2003/0022403 A1 | 1/2003 | Shimoda et al. | |
| 2003/0032210 A1 | 2/2003 | Takayama et al. | |
| 2004/0087110 A1 | 5/2004 | Takayama et al. | |
| 2004/0128246 A1 * | 7/2004 | Takayama et al. | 705/41 |
| 2004/0164302 A1 | 8/2004 | Arai et al. | |
| 2004/0256618 A1 | 12/2004 | Imai et al. | |
| 2005/0037529 A1 | 2/2005 | Nagao et al. | |
| 2005/0042798 A1 | 2/2005 | Nagao et al. | |
| 2005/0106839 A1 | 5/2005 | Shimoda et al. | |
| 2005/0116048 A1 | 6/2005 | Sauter et al. | |
| 2005/0130389 A1 | 6/2005 | Yamazaki et al. | |
| 2005/0133790 A1 | 6/2005 | Kato | |
| 2005/0287846 A1 | 12/2005 | Dozen et al. | |
| 2007/0063057 A1 | 3/2007 | Masubuchi et al. | |
| 2007/0161159 A1 | 7/2007 | Yamazaki et al. | |
| 2007/0166954 A1 | 7/2007 | Yamazaki et al. | |
| 2008/0009125 A1 | 1/2008 | Yamazaki et al. | |

FOREIGN PATENT DOCUMENTS

| | | | |
|---|---|---|---|
| EP | 0607709 | | 7/1994 |
| EP | 1193759 | | 4/2002 |
| JP | 05159585 A | * | 6/1993 |
| JP | 06-299127 | | 10/1994 |
| JP | 07-030209 | | 1/1995 |
| JP | 08-096959 | | 4/1996 |
| JP | 09-063770 | | 3/1997 |
| JP | 09142067 A | * | 6/1997 |
| JP | 2992092 | | 12/1999 |
| JP | 2001-030403 | | 2/2001 |
| JP | 2001-260580 | | 9/2001 |
| JP | 2001-272923 | | 10/2001 |
| JP | 2001-284342 | | 10/2001 |
| JP | 2002-343877 | | 11/2002 |
| JP | 2003-203898 | | 7/2003 |
| JP | 2003-209073 | | 7/2003 |
| WO | WO-00/51181 | | 8/2000 |
| WO | WO-03/010825 | | 2/2003 |
| WO | WO-2005/057658 | | 6/2005 |

OTHER PUBLICATIONS

International Search Report (Application No. PCT/JP2004/018978; PCT7574) Dated Mar. 15, 2005.

Written Opinion (Application No. PCT/JP2004/018978; PCT7574) Dated Mar. 15, 2005.

International Search Report (Application No. PCT/JP2005/001541; PCT7721) Dated Mar. 22, 2005.

Written Opinion (Application No. PCT/JP2005/001541; PCT7721) Dated Mar. 22, 2005.

Shimoda. T et al., "Surface Free Technology by Laser Annealing (SUFTLA),", IEDM 99: Technical Digest of International Electron Devices Meeting, 1999, pp. 289-292.

* cited by examiner

SECURITIES, CHIP MOUNTING PRODUCT, AND MANUFACTURING METHOD THEREOF

BACKGROUND OF THE INVENTION

1. Field of the Invention The present invention relates to a thin film integrated circuit formed on an insulating surface and a chip incorporating the thin film integrated circuit. In particular, the invention relates to securities mounting the chip, other products mounting the chip, and a manufacturing method thereof.

2. Description of the Related Art

In recent years, there has been an increased need for an IC card or an IC tag capable of wireless data communication in all fields that require automatic identification, such as securities and goods management. Such an IC card or an IC tag is required to be small and inexpensive in view of the increased impact resistance and disposable application respectively, to have an affinity for paper particularly in view of the management of securities, and to have a high capacity memory in accordance with the increased amount of data. Thus, in order to meet such requirements, the development of an IC chip over a silicon substrate has been advanced by using various technologies.

As an application of such an IC chip, it is suggested that a minute IC chip is mounted on securities to prevent abuse thereof and to allow the stolen securities to be reused when they are returned to the owner (see Patent Document 1).

[Patent Document 1] Japanese Patent Laid-Open No. 2001-260580

SUMMARY OF THE INVENTION

However, an IC chip formed over a silicon wafer is more expensive than a magnetic card. Accordingly, the IC chip is exclusively used for applications with high added value, which prevents the spread thereof.

Further, in the case where an IC card mounting an IC chip has a security function and the like, a CPU or a memory with a certain capacity is required, leading to an increased area of the IC chip. The IC chip formed over a silicon wafer has a problem of low impact resistance since it is made thin to be used as a card. In particular, an increased area of the IC chip adversely affects the reliability of an IC card.

A chip formed over a silicon wafer is thick. Therefore, when the chip is mounted on products and goods, in particular on papers such as bills or on labels attached to the products and goods, projections and depressions are produced on the surface thereof. As a result, the design of the products and goods becomes less attractive.

In view of the foregoing, the invention provides an ID chip with reduced cost, increased impact resistance and attractive design, as well as products and the like mounting the ID chip. The invention further provides manufacturing methods of the ID chip and the products mounting the ID chip.

In view of the aforementioned problems, according to the invention, an integrated circuit having a semiconductor film with a thickness of 0.2 μm or less, typically 40 to 170 nm, and preferably 50 to 150 nm (hereinafter referred to as a thin film integrated circuit) is mounted on securities including bills, belongings, containers of food and drink, and the like (hereinafter referred to as products and the like). The thin film integrated circuit of the invention is much thinner than a chip formed over a silicon wafer, therefore, it can be mounted on products and the like while maintaining an attractive design.

The thickness of such a thin film integrated circuit having the semiconductor film is in the range of 0.3 to 3 μm in total, and typically about 2 μm.

A thin film integrated circuit having such thinness transmits light differently from a chip formed over a silicon wafer. Thus, the thin film integrated circuit can be preferably mounted on a surface of the products and the like without obstructing the display thereof.

Since the thin film integrated circuit of the invention is formed on an insulating surface, radio wave absorption is not caused and highly sensitive signal reception can be performed as compared with a chip formed over a silicon wafer.

A substrate having an insulating surface includes a glass substrate such as barium borosilicate glass and alumino borosilicate glass, a quartz substrate, a stainless substrate and the like. Other substrates having an insulating surface include a plastic substrate typified by polyethylene terephthalate (PET), polyethylene naphthalate (PEN) and polyether sulfone (PES), and a flexible substrate formed of a synthetic resin such as acryl. A thin film integrated circuit formed over such a substrate having an insulating surface does not have a limit in the size and shape of a mother substrate as compared with a chip formed over a circular silicon wafer. Therefore, the productivity of the thin film integrated circuit of the invention can be increased and mass production can be achieved. As a result, the cost reduction of the thin film integrated circuit is expected. As for the thin film integrated circuit with extremely low unit price, the cost reduction leads to great profits.

Securities include bills, stocks, checks and the like. The chip of the invention can be mounted on these securities as well as certificates such as a license, a family register and a resident card. According to this, abuse of these securities and certificates can be prevented. Besides the securities, the thin film integrated circuit can be mounted on containers of food, drink and the like which include a plastic bottle, a lunch box, a medicine bottle, other containers, labels attached to the containers, and the like. The thin film integrated circuit can also be mounted on belongings such as a bicycle and a car in order to prevent theft thereof or determine the whereabouts of the stolen belongings. Further, the thin film integrated circuit can be mounted on books, CDs, videos and the like as well. In particular, it is preferably mounted on rental products, since the rental procedure can be performed more quickly than the procedure using barcode and data management can be performed smoothly. The thin film integrated circuit may also be mounted on a wrapping paper for wrapping these products and the like. Data inputted to the thin film integrated circuit, e.g., a message and the like can be read by a reader to be displayed on a display device.

The chip of the invention having such a thin film integrated circuit is referred to as an ID chip or a semiconductor device. The invention can also provide a chip having an antenna electrically connected to a thin film integrated circuit. An ID chip incorporating an antenna is also called a contactless ID chip (wireless chip). When the ID chip is used as a tag, it may be called a wireless tag. The ID chip that does not incorporate an antenna but has a terminal connected to an external power source is called a contact ID chip, whereas the ID chip having both functions of contactless type and contact type is called a hybrid ID chip. The chip of the invention has an integrated circuit including a semiconductor film with a thickness of 0.2 μm or less. An advantageous effect can be obtained by applying the present invention can be applied to any one of the contact chip, the contactless chip and the hybrid chip.

The aforementioned products and other products mounting the chip of the invention are referred to as chip mounting products. In addition, products mounting an ID chip may be called ID chip mounting products.

More specifically, the invention provides securities mounting a chip that has an integrated circuit including a semiconductor film with a thickness of 0.2 μm or less, and other chip mounting products.

The invention also provides securities mounting a chip that has an integrated circuit including a semiconductor film with a thickness of 0.2 μm or less, and other chip mounting products, wherein the integrated circuit has a ROM that includes a memory cell having a circuit connection obtained by droplet ejection or laser cutting. Note that the droplet ejection is a method of selectively forming a pattern by selectively ejecting a droplet (also referred to as a dot) of a composition mixed with a material of a conductive film or an insulating film. Therefore, the droplet ejection is also called ink jet printing, screen printing or offset printing depending on the specific process.

The invention also provides securities mounting a chip that has an integrated circuit including a semiconductor film with a thickness of 0.2 μm or less, and other chip mounting products, wherein the thin film integrated circuit has a first ROM that includes a memory cell having a circuit connection obtained by droplet ejection or laser cutting, and a second ROM that includes a memory cell having a circuit connection obtained by photolithography.

The invention also provides securities mounting a chip that has an integrated circuit including a semiconductor film with a thickness of 0.2 μm or less, and other chip mounting products, wherein the thin film integrated circuit has a non-volatile and non-rewritable memory that stores specific data based on variations in characteristics of the semiconductor film. The semiconductor film is formed of a crystalline semiconductor film, and specific data based on variations in characteristics of the crystalline semiconductor film can be stored.

The invention also provides securities mounting a chip that has an integrated circuit including a semiconductor film with a thickness of 0.2 μm or less and has an antenna formed over the integrated circuit, wherein the antenna is electrically connected to the integrated circuit, and other chip mounting products.

The invention also provides securities mounting a chip that has an integrated circuit formed over a first substrate and including a semiconductor film with a thickness of 0.2 μm or less, and has an antenna formed over a second substrate, wherein the antenna is electrically connected to the integrated circuit, and other chip mounting products.

According to such securities of the invention, the semiconductor film is formed on an insulating surface over any one of a glass substrate, a quartz substrate, a stainless substrate, and a flexible substrate formed of a synthetic resin.

According to the invention, the integrated circuit has a thin film transistor including a semiconductor film.

A manufacturing method of securities and other chip mounting products of the invention comprises the steps of forming a semiconductor film with a thickness of 0.2 μm or less, crystallizing the semiconductor film to obtain a crystalline semiconductor film, forming an integrated circuit having the crystalline semiconductor film, and mounting a chip having the integrated circuit.

Another manufacturing method of securities and other chip mounting products of the invention comprises the steps of forming a semiconductor film with a thickness of 0.2 μm or less, crystallizing the semiconductor film to obtain a crystalline semiconductor film, forming an integrated circuit by forming a metal wiring over the crystalline semiconductor film by photolithography to obtain a first memory cell having a circuit connection obtained by the metal wiring and by forming a metal wiring over the crystalline semiconductor film by droplet ejection or laser cutting to obtain a second memory cell having a circuit connection obtained by the metal wiring, and mounting a chip having the integrated circuit.

Another manufacturing method of securities and other chip mounting products comprises the steps of forming a semiconductor film with a thickness of 0.2 μm or less, crystallizing the semiconductor film by laser irradiation to obtain a crystalline semiconductor film, forming an integrated circuit having the crystalline semiconductor film, and mounting a chip having the integrated circuit.

Another manufacturing method of securities and other chip mounting products of the invention comprises the steps of forming a semiconductor film with a thickness of 0.2 μm or less, adding a metal element to the semiconductor film and crystallizing by heating to obtain a first crystalline semiconductor film, crystallizing the first crystalline semiconductor film by laser irradiation to obtain a second crystalline semiconductor film, forming an integrated circuit having the second crystalline semiconductor film, and mounting a chip having the integrated circuit.

In such a manufacturing method of securities and other chip mounting products, a channel forming region of the semiconductor film may be formed so that the direction of laser irradiation is the same as the moving direction of carriers, and the chip may be mounted while being fixed so as to be bent in the direction perpendicular to that of laser irradiation. As a result, a thin film transistor can be prevented from being peeled off or damaged.

In such a manufacturing method of securities and other chip mounting products, an antenna electrically connected to the integrated circuit may be formed. The antenna may be arranged symmetrically with the integrated circuit interposed therebetween. Further, the antenna may be formed over a second substrate that is folded so as to interpose the integrated circuit, thereby the antenna is arranged symmetrically with the integrated circuit interposed therebetween.

As being formed on an insulating surface, the chip of the invention can be reduced in cost as compared with a conventional chip formed over a silicon wafer. In particular, a chip formed over a circular silicon wafer has a limit in the size and shape of a mother substrate. Meanwhile, the chip of the invention does not have a limit in the size and shape of a mother substrate since an insulating substrate such as a glass substrate is employed. Therefore, the productivity is increased and mass production can be achieved, resulting in further reduction in cost. In the integrated circuit with extremely low unit price such as a chip, the cost reduction leads to great profits.

In addition, the thin film integrated circuit can be formed over a flexible substrate formed of a synthetic resin, thus it is expected that the impact resistance of the chip is increased.

Further, the thin film integrated circuit of the invention is drastically reduced in thickness as compared with a conventional integrated circuit formed over a silicon wafer, and can transmit light. Accordingly, the thin film integrated circuit of the invention can be attached to products while maintaining an attractive design.

According to such a thin film integrated circuit of the invention, the exchange or the management of data can be performed more simply and in a shorter time, and various data exchange can be achieved as compared with other data exchange means such as bar code.

DETAILED DESCRIPTION OF THE INVENTION

Figure 1A:
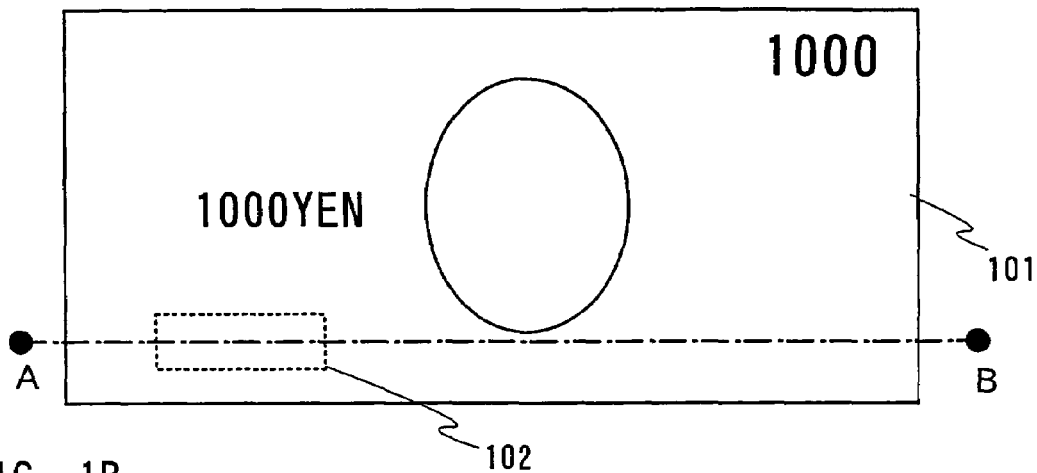
FIGS. 1A to 1C are views of products each mounting an ID chip.

Although the invention will be described by way of Embodiment Modes with reference to the accompanying drawings, it is to be understood that various changes and modifications will be apparent to those skilled in the art. Therefore, unless such changes and modifications depart from the scope of the invention, they should be constructed as being included therein. Note that the identical portions or portions having the same function are denoted by the same reference numerals in all the drawings for describing Embodiment Modes, and will be described in no more detail.

Further, in order to accentuate a chip, it is shown larger than it really is in Embodiment Modes described below.

Embodiment Mode 1

Described in this embodiment mode are products each mounting an ID chip. The position, the size and shape, and the number of mounted ID chips are not limited to the ones shown in this embodiment mode.

When a memory such as a ROM to which data cannot be rewritten is formed in a thin film integrated circuit included in an ID chip, it is possible to prevent forgery of securities such as bills and checks, and certificates such as a family register, a resident card, a traveler's check, and a passport. In addition, when a wireless tag of the invention is used for foods whose commercial value depends crucially on a production area, a producer and the like, forgery of production area, producer and the like can be prevented at low cost.

Various products mounting an ID chip are shown below.

FIG. 1A shows a bill 101 mounting an ID chip. Although an ID chip 102 is mounted inside the bill 101 in FIG. 1A, it may be exposed on a surface thereof.

The bill may be printed by using ink containing the ID chip of the invention. Further, a plurality of ID chips may be scattered when mixing a material of the bill and chemicals to form a bill mounting the plurality of ID chips. Since the ID chip of the invention is low in cost, a plurality of ID chips can be mounted on the bill without adversely affecting the production cost of the bill.

The ID chip may be mounted on a coin as well as the bill.

Figure 1B:
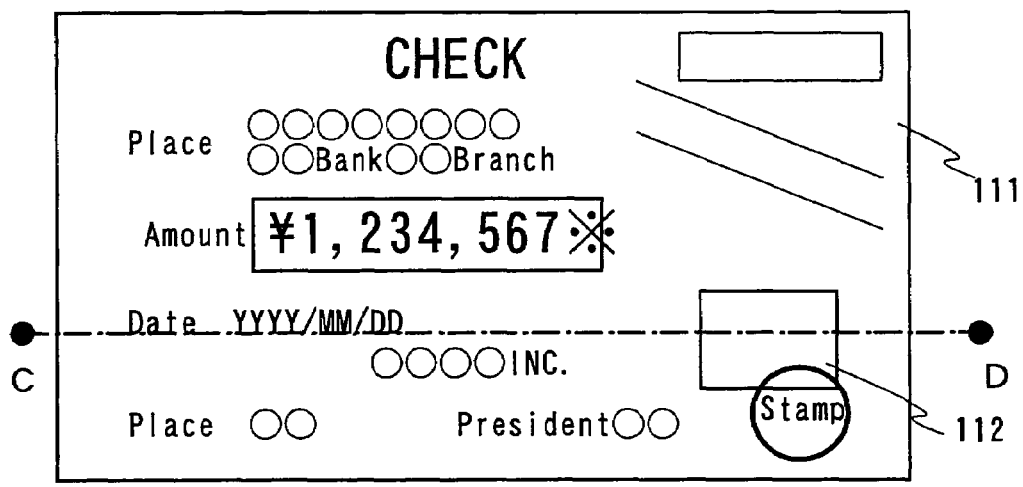

FIG. 1B shows a check 111 mounting an ID chip. In FIG. 1B, an ID chip 112 is exposed on a surface of the check 111. Since the ID chip of the invention transmits light, it may be exposed on a surface of the check 111. It is needless to say that the ID chip 112 may be mounted inside the check 111.

The check may be printed by using ink containing the ID chip of the invention.

Further, a plurality of ID chips may be scattered when mixing a material of the check and chemicals to form a check mounting the plurality of ID chips. Since the ID chip of the invention is low in cost, a plurality of ID chips can be mounted on the check without adversely affecting the production cost of the check.

Figure 1C:
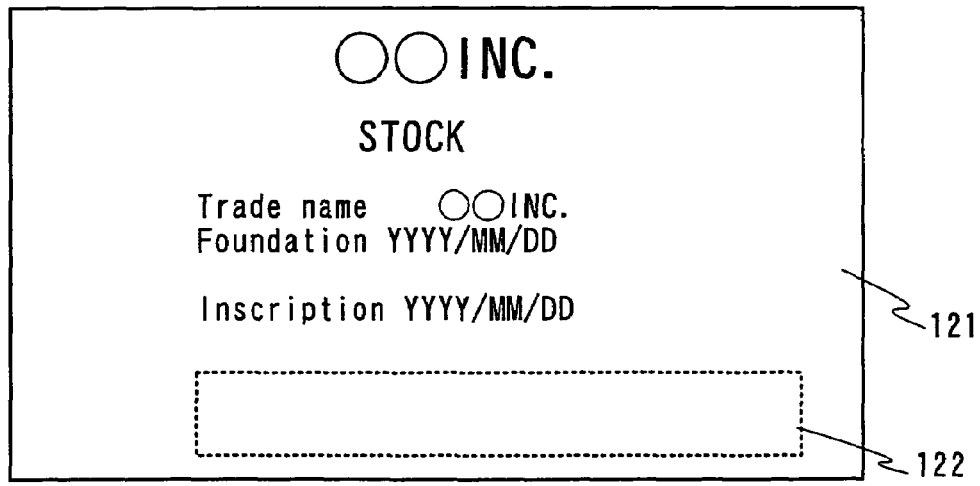

FIG. 1C shows a stock 121 mounting an ID chip. Although an ID chip 122 is mounted inside the stock 121 in FIG. 1C, it may be exposed on a surface thereof. The size and shape, and the position of the ID chip are not exclusively limited. In the case of a large amount of data being included, however, the ID chip may be made larger.

The stock may be printed by using ink containing the ID chip of the invention. Further, a plurality of ID chips may be scattered when mixing a material of the bill and chemicals to form a stock mounting the plurality of ID chips. Since the ID chip of the invention is low in cost, a plurality of ID chips can be mounted on the stock without adversely affecting the production cost of the stock.

As set forth above, the ID chip is formed of a thin film integrated circuit that is drastically reduced in thickness, thus it can be mounted on quite thin paper products. Therefore, attractive design of products can be maintained. In addition, since the ID chip transmits light, it may be mounted on a surface of a product.

Figure 2A:
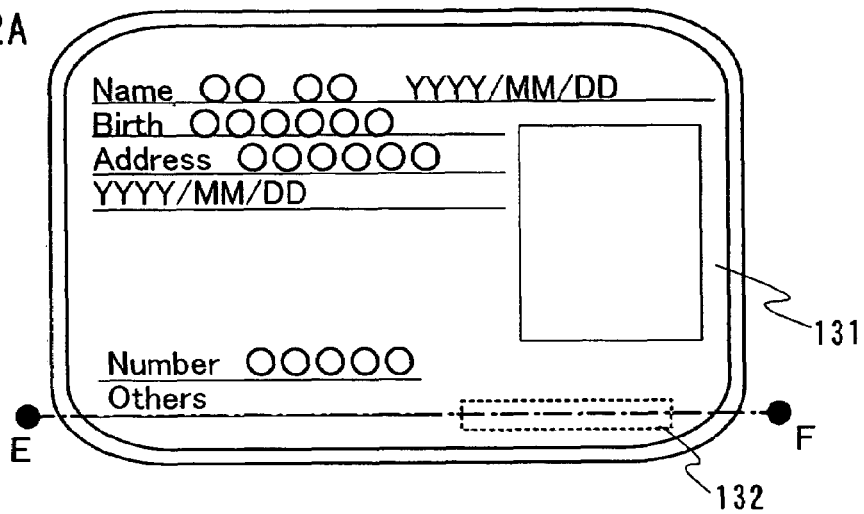
FIGS. 2A to 2C are views of products each mounting an ID chip.

FIG. 2A shows a license 131 mounting an ID chip. Although an ID chip 132 is mounted inside the license 131 in FIG. 2A, it may be mounted under a laminate film covering the license 131. Since the ID chip of the invention transmits light, it may be mounted on a printed surface of the license 131.

Figure 2B:
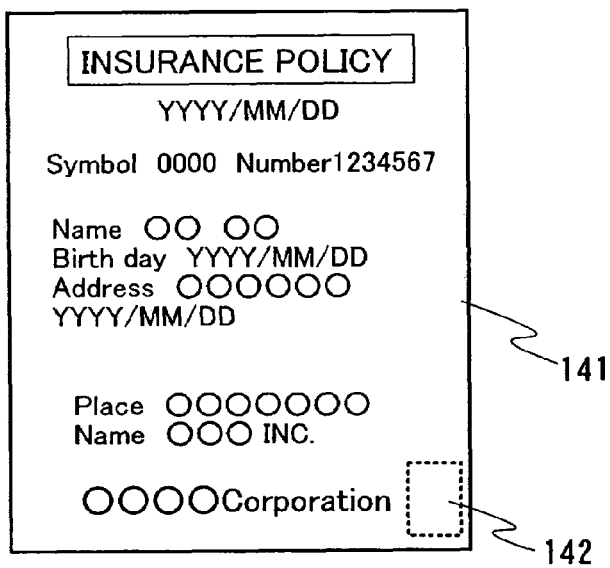

FIG. 2B shows an insurance policy 141 mounting an ID chip. Although an ID chip 142 is mounted inside the insurance policy 141 in FIG. 2B, it may be mounted on a surface thereof. Since the ID chip of the invention transmits light, it may be mounted on a printed surface of the insurance policy 141.

Figure 2C:
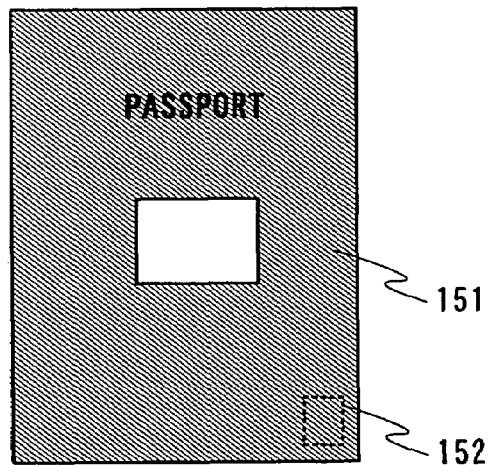

FIG. 2C shows a passport 151 mounting an ID chip. Although an ID chip 152 is mounted on a cover of the passport 151 in FIG. 2C, it may be mounted on other pages. The ID chip may be mounted either inside or on the surface of the cover and the like. Since the ID chip of the invention transmits light, it may be mounted on a printed surface of the passport 151.

When the ID chip is mounted on the aforementioned products, abuse thereof can be prevented. The ID chip also facilitates the management of the products. In addition, data and the like can be stored in the ID chip without being written directly to the products, resulting in privacy protection. Needless to say, attractive design of the products can be maintained since a thin film integrated circuit that is drastically reduced in thickness is used. Further, the ID chip, which transmits light, can be mounted on a surface of the products.

Figure 3A:
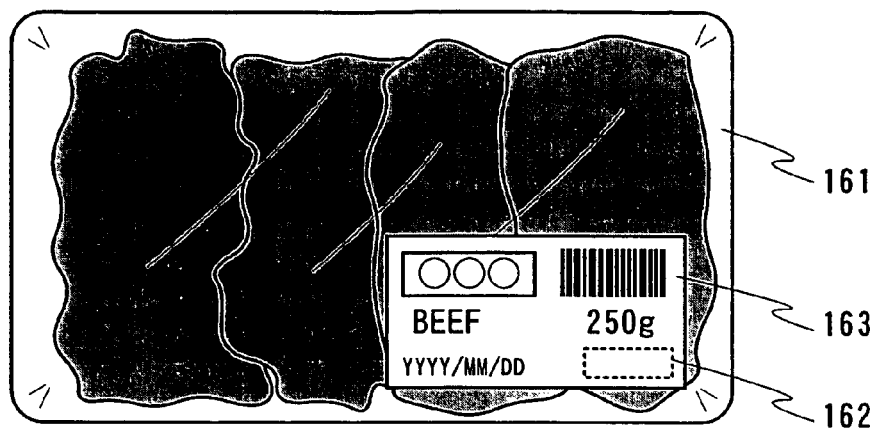
FIGS. 3A to 3C are views of products each mounting an ID chip.

FIG. 3A shows a display label 163 mounting an ID chip, which is attached to a pack of meat 161. An ID chip 162 may be exposed on a surface of the display label 163 or mounted inside it. The ID chip may also be mounted on a cellophane for wrapping fresh food such as vegetables. When the price of a product is written to the ID chip as data, the product can be paid more simply and in a shorter time. That is, differently from the case of a conventional bar code being used, a plurality of products can be paid at a time when the ID chip is mounted thereon. Further, the products can be paid at the cash register even when there is a distance between the products and the cash register, and shoplifting and the like can also be prevented. It is needless to say that the ID chip can store basic data of the product such as a production area, a producer, a processing date, and a use-by date, as well as other data such as a serving suggestion for the product. In the case of the ID chip and the bar code both being used, non-rewritable data such as the aforementioned basic data may be stored in the bar code whereas rewritable data may be stored in the ID chip.

Figure 3B:
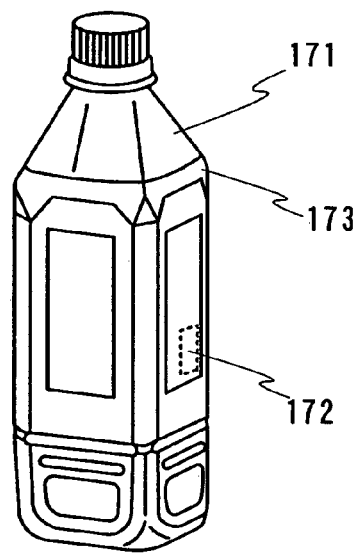

FIG. 3B shows a display label 173 mounting an ID chip, which is attached to a plastic bottle 171. An ID chip 172 may be exposed on a surface of the display label 173 or mounted inside it. Alternatively, the ID chip 172 may be attached to a cap of the plastic bottle 171 or mounted inside the plastic bottle 171. For example, in the case of the plastic bottle being constituted by a plurality of layers, the ID chip 172 may be mounted between the layers.

Figure 3C:
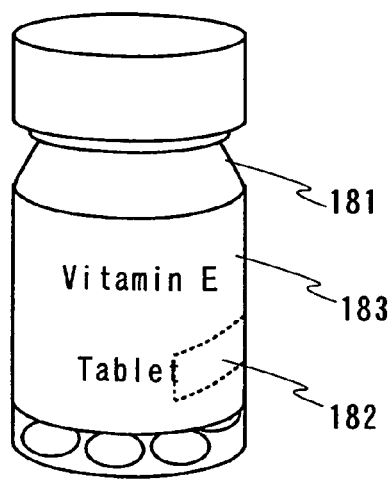

FIG. 3C shows a display label 183 mounting an ID chip, which is attached to a medicine bottle 181. An ID chip 182 may be exposed on a surface of the display label 183 or mounted inside it. The ID chip 182 may also be attached to a cap of the medicine bottle 181. When the product is medicine, the ID chip 182 may store data such as dosage instruction, effects and side effects of the medicine, and allergy data.

Such data about the product is required to be given to consumers over the counter, therefore, a reader and a display device may preferably be set in the shop. Instead, an electronic apparatus carried by consumers may have functions of a reader and a display device. For example, a mobile phone or a PDA may be equipped with a reader function to display data on the screen thereof.

Since the ID chip of the invention is inexpensive, it is effectively used as the disposable one that is thrown away by consumers. In particular, the inexpensive ID chip of the invention is quite effective for a product, increase in the price of which even by a few yens or a few tens of yens has a great effect on sales.

Figure 4A:
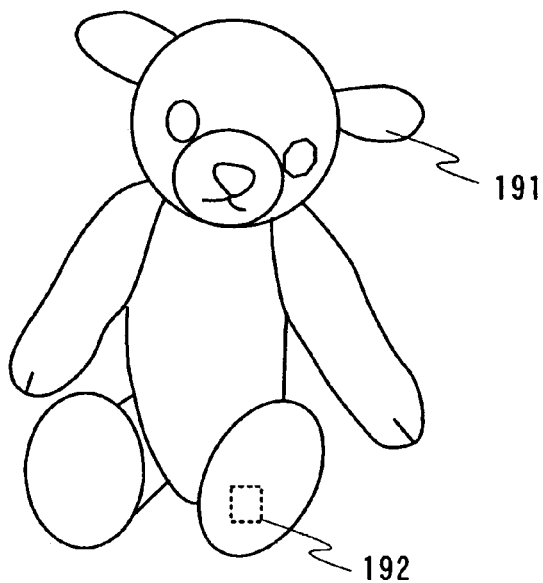
FIGS. 4A to 4C are views of products each mounting an ID chip.

FIG. 4A shows a plushie 191 mounting an ID chip. An ID chip 192 may be mounted inside the plushie 191. The ID chip 192 may also be attached to a surface of the eyes or the nose of the plushie 191. Since the ID chip of the invention transmits light, it can be mounted on a surface of the plushie. The ID chip allows the whereabouts of the plushie to be determined even when it is lost or stolen.

Figure 4B:
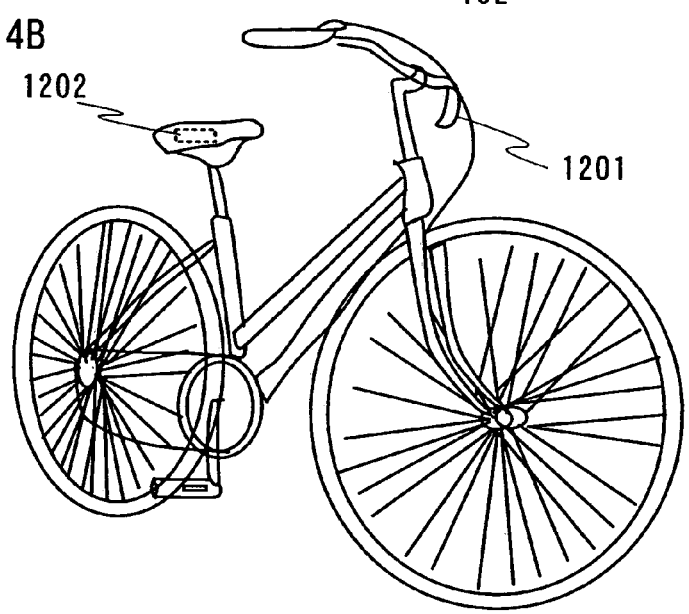

FIG. 4B shows a bicycle 1201 as an example of a vehicle mounting an ID chip. An ID chip 1202 may be mounted inside a saddle, or attached to a handlebar, a pedal or a tire. The ID chip allows the whereabouts of the bicycle to be determined even when it is lost or stolen.

Figure 4C:

FIG. 4C shows an umbrella 211 mounting an ID chip. An ID chip 212 may be mounted inside a stick or a cloth. The ID chip may also be attached on a surface of the stick or the cloth.

Figure 24:
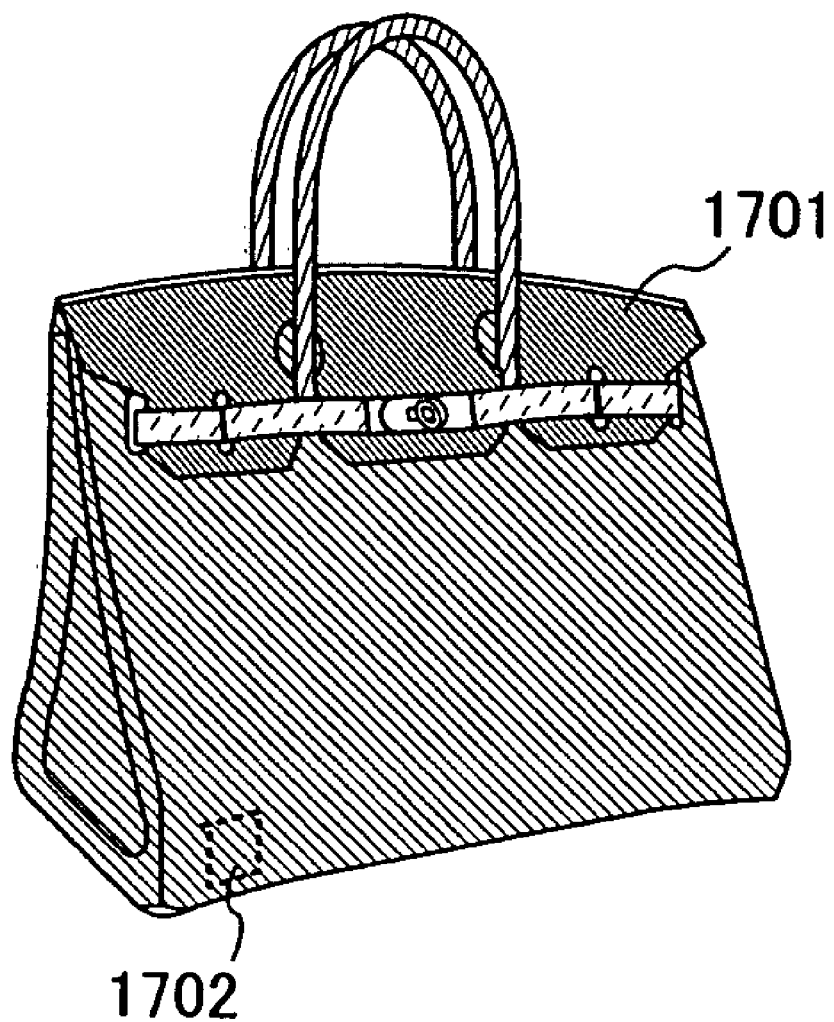
FIG. 24 is a view of a product mounting an ID chip.

FIG. 24 shows a bag 1701 mounting an ID chip 1702. For example, the ID chip 1702 may be mounted on a bottom or a side of the bag 1701. Since the ID chip is extremely thin and small, it can be mounted while maintaining attractive design of the bag. In addition, the ID chip can transmit light, thus it cannot be recognized easily by a thief. Accordingly, there is no fear that the ID chip is removed by a thief.

In the case of such products mounting the ID chip being stolen, data about the whereabouts of the products can be obtained by using GPS (Global Positioning System), for example. Note that the GPS is a system for determining the position with the time difference between the time a signal was transmitted by a GPS satellite and the time it was received.

Besides the stolen products, the whereabouts of a lost property or a thing left behind can be determined by the GPS.

By mounting the ID chip on such belongings, the whereabouts thereof can be determined even when being lost or stolen.

The ID chip may be mounted on a wrapping paper for wrapping such belongings. Further, a message can be written to the ID chip as audio data. In that case, the data is read by a reader and the message can be checked by a reproducing apparatus.

Figure 5A:
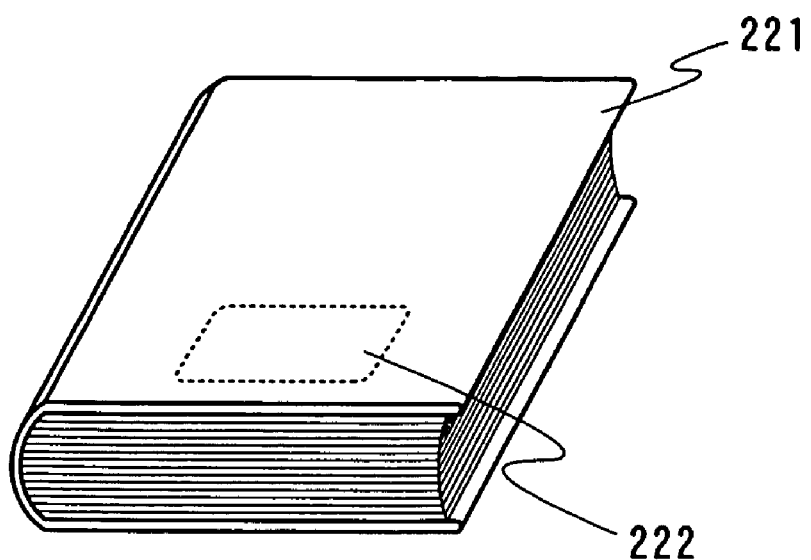
FIGS. 5A and 5B are views of products each mounting an ID chip.

FIG. 5A shows a book 221 mounting an ID chip. An ID chip 222 can be mounted on a surface of or inside a cover of the book 221. Instead, the ID chip 222 may be mounted on any other page of the book 221.

Figure 5B:
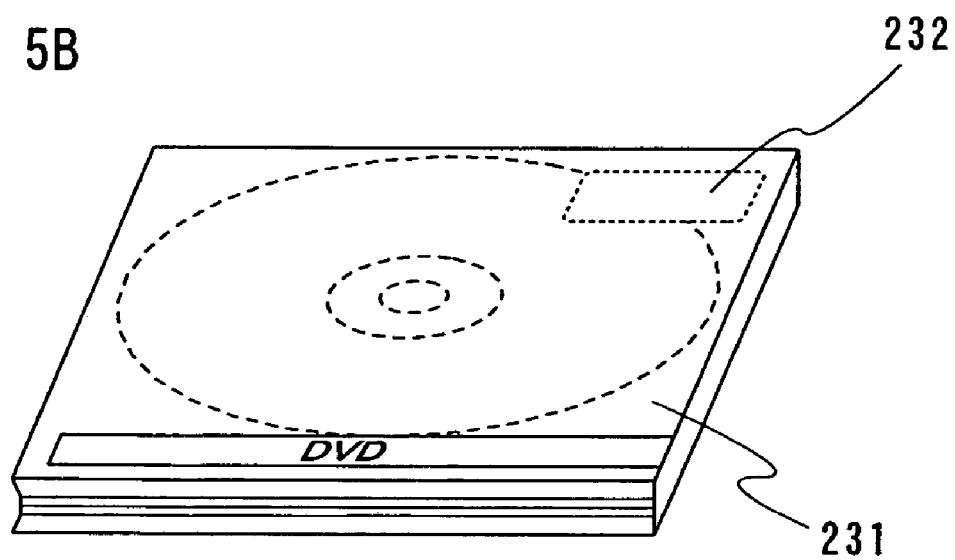

FIG. 5B shows a DVD 231 mounting an ID chip. An ID chip 232 can be mounted on a surface of or inside a package of the DVD 231. It is needless to say that the ID chip may be mounted on other products than the DVD, such as a CD and a video tape.

When the ID chip is mounted on such products of which rental business is actively conducted, rental services can be performed more simply and in a shorter time. In addition, the ID chip can store data of the products such as the content, publicity and cast.

The ID chip of the invention can be changed in size and shape to some extent depending on the size and shape of a product to which the ID chip is attached. Accordingly, applications of the wireless tag of the invention are not limited to the ones shown in this embodiment mode, and other various applications are available. In addition, the wireless tag of the invention can be improved in mechanical strength as compared with a wireless tag using an IC chip formed over a silicon wafer.

Figure 25A:
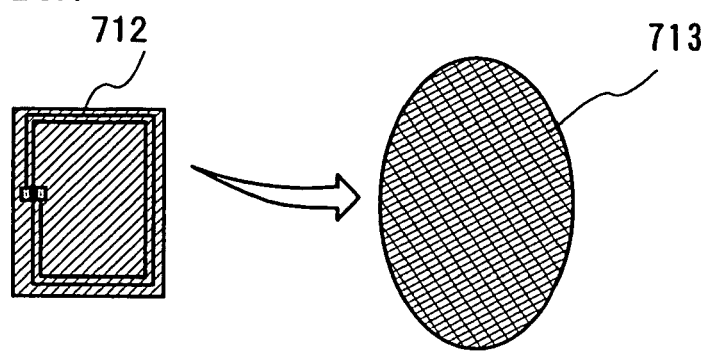
FIGS. 25A and 25B are views of products each mounting an ID chip.

Described next is the case of mounting an ID chip on products such as a beer bottle for distribution management. As shown in FIG. 25A, an ID chip 712 is mounted on a beer bottle 711 using, for example, a label 713.

Figure 25B:
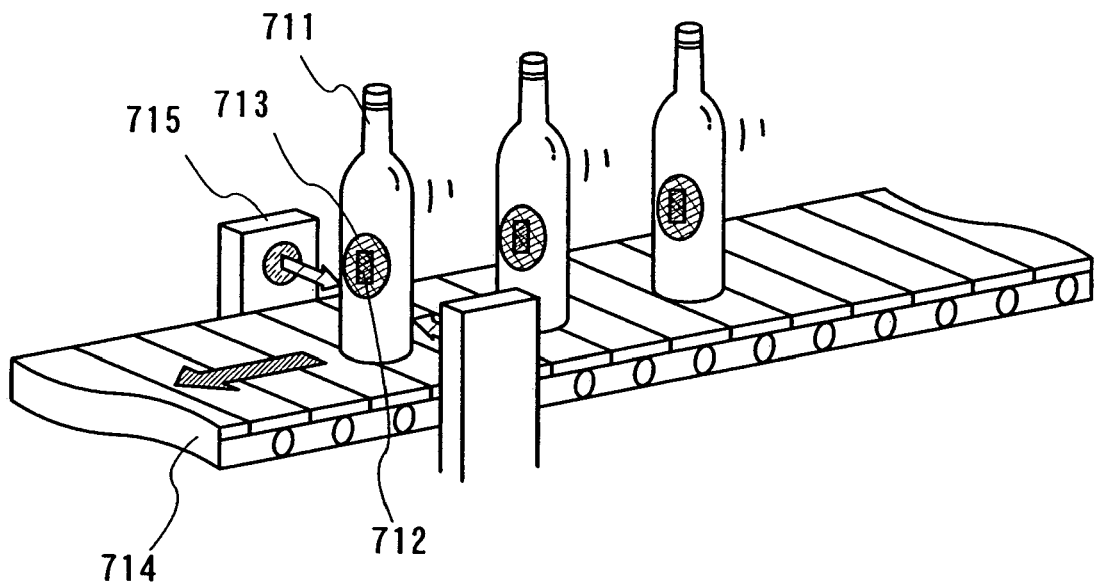

The ID chip 712 stores basic data such as a manufacturing date, a manufacturing area and employed materials. Such basic data is not required to be rewritten, thus it may be stored in a non-rewritable memory such as a mask ROM. The ID chip also stores individual data such as a delivery address and a delivery date. For example, as shown in FIG. 25B, when each beer bottle moving on a conveyor belt 714 passes a writer 715, each delivery address and delivery date can be stored. Such individual data may preferably be stored in a rewritable and erasable memory such as an EEPROM.

A system may preferably be configured such that when data of a purchased product is transferred from a delivery destination to a distribution management center via a network, the delivery address and date are calculated by a writer, a personal computer for controlling the writer or the like, and stored in the ID chip.

Since the bottles are delivered per case, the ID chip may be mounted on each case or every several cases to store individual data.

When the ID chip is mounted on such drinks for storing a plurality of delivery addresses, the time required for data input can be reduced as compared with the case of manual input, resulting in reduced input error. In addition, it is possible to lower labor costs that are the most costly expenses in the distribution management. Thus, by mounting the ID chip, the distribution management with few errors can be achieved at low cost.

Further, additional data such as food that is good with beer and a recipe with beer may be stored at the delivery destination. As a result, the food and the like can be promoted and consumers' willingness to buy can be increased. Such additional data may be stored in a rewritable and erasable memory such as an EEPROM. In this manner, the ID chip allows an increase in the amount of data given to consumers, thus they can purchase products at ease.

Described next are a product mounting an ID chip and a manufacturing apparatus (manufacturing robot) controlled based on data of the ID chip in order to perform manufacturing management.

In recent years, original products are often manufactured, and they are manufactured on a production line based on the original data of the products. For example, in a production line of cars that can provide free color choice of doors, an ID chip is mounted on a part of each car and a painting apparatus is controlled based on the data of the ID chip. Accordingly, an original car can be manufactured.

When the ID chip is mounted, there is no need to control the order and color of cars to be put into a production line in advance. Therefore, it is not necessary to set a program for controlling a painting apparatus in accordance with the order and number of cars. That is, a manufacturing apparatus can operate individually based on data of the ID chip mounted on each car.

As set forth above, the ID chip can be applied to various fields. Based on the data stored in the ID chip, individual manufacturing data can be obtained and a manufacturing apparatus can be controlled based on the individual data.

Figure 6A:
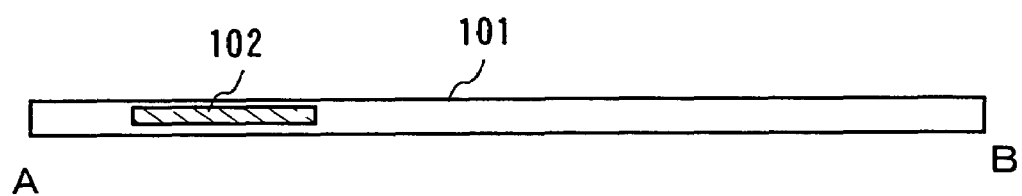
FIGS. 6A to 6C are cross sectional views of products each mounting an ID chip.
Figure 6B:
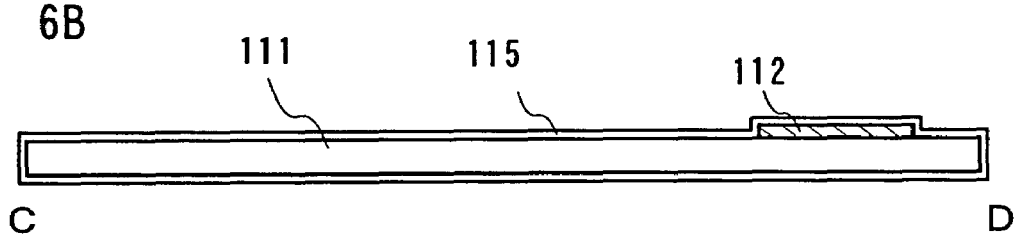
Figure 6C:
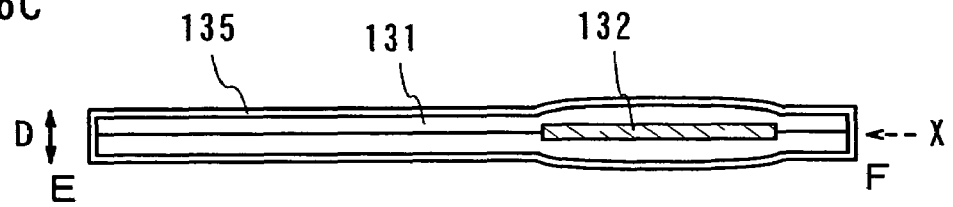

FIGS. 6A to 6C are cross sectional views of a product mounting an ID chip.

FIG. 6A is a cross sectional view of the bill 101 mounting an ID chip that is shown in FIG. 1A. Shown in FIG. 6A is a condition in which the ID chip 102 is mounted inside the bill 101.

FIG. 6B is a cross sectional view of the check 111 mounting an ID chip that is shown in FIG. 1B. Shown in FIG. 6B is a condition in which the ID chip 112 is mounted on a surface of the check 111. More preferably, an insulating film 115 is formed so as to cover the check 111.

FIG. 6C is a cross sectional view of the license 131 mounting an ID chip that is shown in FIG. 2A. The ID chip 132 is sandwiched between substrates for the license 131. Further, an insulating film 135 is formed so as to cover the license 131.

In the case of the ID chip being mounted on such sheet products, the ID chip may be disposed at the center of a product for mounting the ID chip so as to be surrounded by a material of the product. As a result, mechanical strength of the ID chip can be improved. More specifically, when a thickness of the product is D, a position of the ID chip interposed (a center of the ID chip) X may be set at $(1/2) \cdot D - 30 \ \mu m < X < (1/2) \cdot D + 30 \ \mu m$.

As set forth above, the ID chip including a thin film integrated circuit that is drastically reduced in thickness allows various data exchange. Further, by using the ID chip, the exchange or management of data can be performed more simply and in a shorter time. In addition, as being extremely thin, the ID chip can be mounted on a label attached to a container of products while maintaining an attractive design.

The thin film integrated circuit of the invention does not require a back grinding process causing cracks and polish lines, which is needed for an integrated circuit formed over a silicon wafer. In addition, variations in thickness of the thin film integrated circuit of the invention depend on variations in thickness of deposited semiconductor films, which are at most about a few hundreds nm and much smaller than variations of a few to a few tens µm due to the back grinding process.

The ID chip of the invention, which is formed over an inexpensive mother substrate such as a glass substrate, can be formed at a lower cost than a chip formed over a silicon wafer. In addition, a chip formed over a circular silicon wafer has a limit in the size and shape of a mother substrate. Meanwhile, the chip of the invention does not have a limit in the size and shape of a mother substrate since an insulating substrate such as a glass substrate is employed. Therefore, the productivity is increased, the reduction in cost is achieved, and the size and shape of the ID chip can be set arbitrarily.

In terms of materials, the ID chip of the invention is formed of a less expensive and safer material as compared with a chip formed over a silicon wafer. Thus, the necessity of collecting used ID chips is decreased, which is thus not harmful to the environment. When the ID chip is thrown away, it can be cut with scissors and the like since it has a certain area, which prevents abuse thereof.

An IC chip formed over a silicon wafer may have a problem in its sensitivity to signals due to radio wave absorption caused by the silicon wafer. In particular, the problem of the radio wave absorption is concerned in the case of a normally used frequency of 13.56 MHz or 2.45 GHz. On the other hand, the ID chip of the invention, which is formed over an insulating substrate such as a glass substrate, does not cause radio wave absorption. As a result, a highly sensitive ID chip can be achieved, thus an antenna of the ID chip of the invention can be reduced in area and miniaturization of the ID chip can be expected.

An IC chip formed over a silicon wafer with semiconductivity has a junction that is easily forward-biased with respect to AC radio waves, which requires measures for latch up. On the other hand, the ID chip of the invention that includes a thin film integrated circuit formed over an insulating substrate does not have such a problem.

The contactless ID chip incorporating an antenna is described above. However, a contact ID chip that does not incorporate an antenna but includes a terminal connected to an external power source may also be mounted to a product. Alternatively, a hybrid ID chip having both functions of contactless type and contact type may be mounted as well. The invention provides a thin film integrated circuit formed on an insulating surface, and can be applied to any one of the contact chip, the contactless chip and the hybrid chip.

Embodiment Mode 2

As set forth above, a thin film integrated circuit and an antenna are required for a contactless ID chip. Various arrangements are available for the antenna, and a connecting terminal connected to the thin film integrated circuit may be provided at the end of the antenna. Described in this embodiment mode are the size and shape, manufacturing method and mounting method of the antenna that is incorporated in the ID chip.

First, the size and shape of an antenna are explained.

Figure 7A:
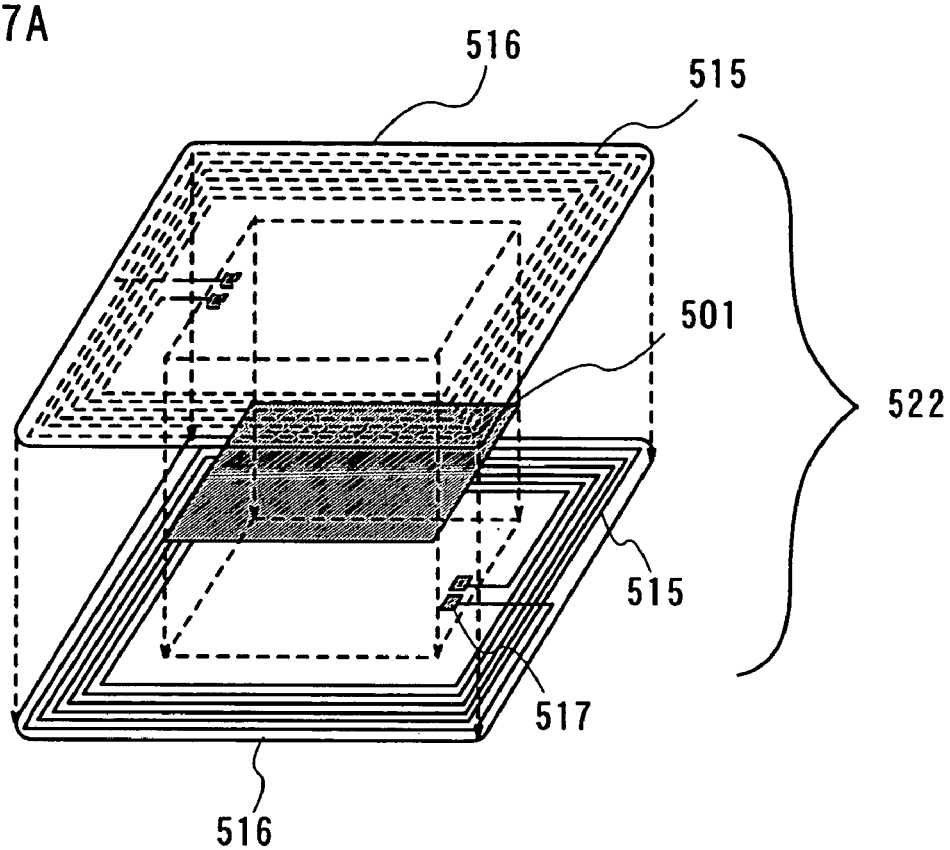
FIGS. 7A and 7B are views of modes of an ID chip.

For example, an antenna 515 is formed over a substrate 516 for mounting the antenna (hereinafter referred to as an antenna substrate) so as to be twisted, and a connecting terminal 517 is provided at the end of the antenna 515 as shown in FIG. 7A. The connecting terminal 517 may be disposed anywhere, and the arrangement thereof can be determined depending on a connecting terminal of a thin film integrated circuit.

An antenna 515 may wind in a rectangular shape, and a connecting terminal 517 may be provided at the end of the antenna 515. The connecting terminal 517 may be disposed anywhere, and the arrangement thereof can be determined depending on a connecting terminal of a thin film integrated circuit. Each connecting terminal may be disposed so as to be far from or close to each other.

An antenna 515 may be formed in a circular shape instead of a rectangular shape.

Next, a manufacturing method of an antenna is explained.

An antenna 515 is formed over an antenna substrate 516 so as to have the aforementioned arrangement. The antenna 515 can be formed of a conductive material such as Ag (silver), Al (aluminum), Au (gold), Cu (copper), and Pt (platinum). When using Al or Au that has a relatively high resistance, wiring resistance may occur. However, wiring resistance can be reduced by increasing the thickness of the antenna 515 or increasing the width thereof in the case of a large area being occupied by the antenna 515. When using a conductive material such as Cu that may diffuse, an insulating film functioning as a protective film may be formed so as to cover a surface on which the antenna 515 is formed or surround the periphery of Cu. The antenna 515 can be formed by sputtering, droplet ejection, printing, electroplating, photolithography, or vapor deposition using a metal mask. In particular, when the antenna 515 is formed by droplet ejection, printing, or electroplating, a conductive film is not required to be patterned, resulting in reduced manufacturing steps.

More preferably, pressure is applied to the antenna 515 to improve the planarity. According to this, the antenna 515 can be reduced in thickness. A heating means may be provided as well as a pressing means, and in that case, press treatment and heat treatment can be performed at a time.

Further, an opening may be formed in the antenna substrate 516 and the antenna 515 may be formed in the opening. Since the antenna 515 can be formed inside the opening, the antenna substrate 516 can be reduced in thickness.

Subsequently, a mounting method of an antenna and a thin film integrated circuit is specifically explained.

An antenna substrate and a thin film integrated circuit that are formed based on the aforementioned embodiment mode are mounted. As shown in FIG. 7A, antennas 515 are formed over a pair of antenna substrates 516. A thin film integrated circuit 501 is formed between the antenna substrates 516, namely, the antenna substrates 516 are arranged symmetrically with the thin film integrated circuit 501 interposed therebetween. Then, connecting terminals 517 of the antennas 515 and the thin film integrated circuit 501 are fixed to be connected to each other. They may be connected by wire bonding. Thus, an ID chip 522 is completed.

Figure 7B:
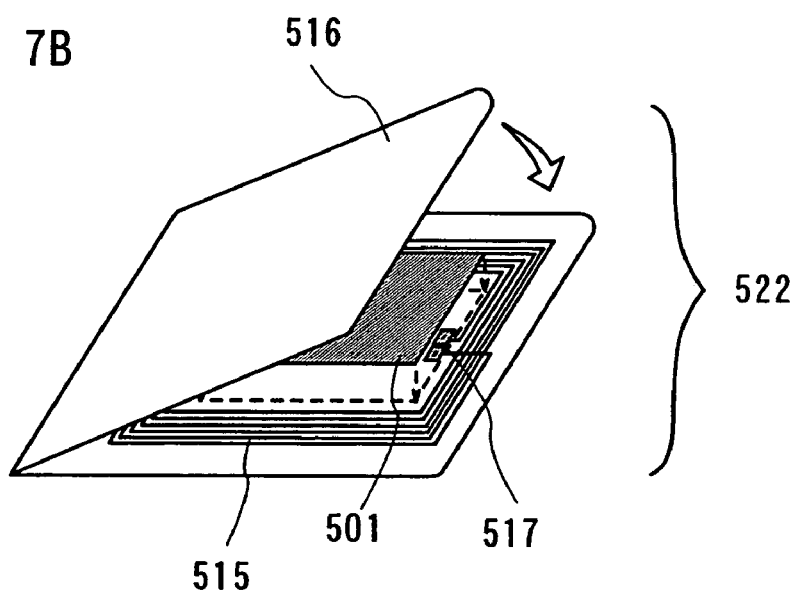

FIG. 7B shows a different mounting method of the thin film integrated circuit than that shown in FIG. 7A.

As shown in FIG. 7B, a pair of antennas 515 are formed over the antenna substrates 516. The antenna substrates 516 are formed of a flexible substrate that can be folded at the center, such as polyethylene terephthalate (PET), vinylidene chloride and vinyl chloride resin.

Subsequently, the antenna substrates 516 are folded so as to sandwich the thin film integrated circuit 501. In order to facilitate the folding, a cut or a recessed portion may be formed in the fold of the antenna substrates 516. Then, the connecting terminals 517 of the antennas 516 and the thin film integrated circuit 501 are fixed so as to be connected to each other. They may be connected by wire bonding. Thus, the ID chip 522 is completed.

When a pair of antennas are provided, one of the antennas can be used for a power source generating circuit and the other can be used for a modulation circuit. As a result, an antenna can be set for each circuit, which increases communication distance and sensitivity.

Since the thin film integrated circuit is connected to a pair of antennas, respective connecting terminal portions are required to be formed on each surface (top and bottom) of the thin film integrated circuit. In addition, an insulating film functioning as a protective film is required to be provided in order to prevent the antennas from being short-circuited. The insulating film can be formed of an organic material or an inorganic material. As the organic material, polyimide, acryl, polyamide, polyimide amide, resist, benzocyclobutene, siloxane, or polysilazane can be employed. Siloxane is formed by using, as a starting material, a polymer which has a skeleton constructed from the bond of silicon (Si) and oxygen (O) and has at least a hydrogen substituent or one or more substituents selected from fluorine, an alkyl group, and aromatic hydrocarbon. Polysilazane is formed by using, as a starting material, a polymer material having a silicon (Si)-oxygen (O) bond, namely a liquid material containing polysilazane. As the inorganic material, silicon oxide or silicon nitride can be employed. The insulating film can be formed by plasma CVD, low pressure CVD, droplet ejection, spin coating, or dip coating. In the case of a material with high viscosity being used, droplet ejection, spin coating, or dip coating is preferably used. A conductive resin may be applied between the connecting terminal portions and an insulating resin may be applied in the other area.

Alternatively, an opening may be formed in the antenna substrate and the connecting terminal portion of the antenna may be formed on the back side of the antenna substrate (a surface on which the antenna is not formed). According to this, short circuit between the antennas can be prevented.

Although a thin film integrated circuit is formed between a pair of antenna substrates in this embodiment mode, it may be formed over one antenna substrate.

Further, the antenna substrate is not necessarily used as shown in this embodiment mode, and the antenna may be formed over a thin film integrated circuit with an insulating film interposed therebetween.

Described hereinafter is a method of manufacturing a plurality of ID chips over a large substrate, namely a multiple pattern technology.

For example, a plurality of (e.g., 25) thin film integrated circuits are formed over a large substrate. Then, the large substrate is disposed between the antenna substrates, and connecting terminals of each thin film integrated circuit and connecting terminals of each antenna are fixed to be connected to each other.

Subsequently, a plurality of ID chips are formed over the large substrate and separated by scribing or dicing to complete each ID chip. Note that the ID chips may be separated by laser irradiation. Particularly in the case of the ID chips being cut, it is considered that the ID chips are not damaged easily as compared with chips formed over a silicon wafer. Therefore, the cutting area of the ID chips can be made smaller than that of the chips formed over a silicon wafer. As a result, an area occupied by the antennas can be increased. Further, the ID chip may be sealed with an insulating film functioning as a sealing film.

As set forth above, when a plurality of ID chips are formed over a large substrate, the cost reduction of the ID chips can be achieved. In the integrated circuit with extremely low unit price such as a chip, the cost reduction leads to great profits.

For example, the number of chips formed over a silicon wafer with a diameter of 12 inches is compared with that of chips formed over a glass substrate with a size of 7300×9200 mm². The area of the former silicon wafer is about 73000 mm² whereas the area of the latter glass substrate is about 672000 mm², that is, the glass substrate is about 9.2 times as large as the silicon substrate. The latter glass substrate with an area of about 672000 mm² can include, without taking into consideration the cutting margin, about 672000 ID chips each having a 1 mm square area, which is about 9.2 times as many as the silicon substrate. Since mass production of the ID chip using the glass substrate with a size of 7300×9200 mm² can be achieved with fewer steps than that using the silicon substrate with a diameter of 12 inches, the amount of capital investment can be reduced to one-third.

Next, a completed ID chip is explained. Described below is an ID chip having an antenna that is formed over a thin film integrated circuit without using an antenna substrate.

Figure 8A:
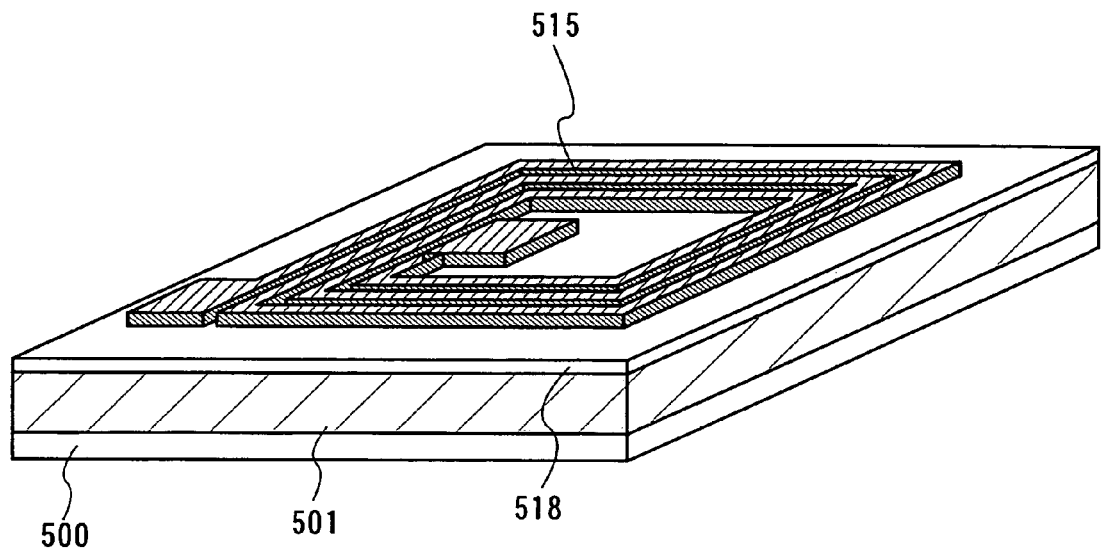
FIGS. 8A and 8B are views of modes of an ID chip.

As shown in FIG. 8A, the area having a thin film integrated circuit (thin film integrated circuit area) 501 is formed over the substrate 500 having an insulating surface. The antenna 515 is formed over the thin film integrated circuit area 501 with an insulating film 518 interposed therebetween. The antenna 515 can be formed, for example, by droplet ejection. The insulating film 518 can be formed similarly to the aforementioned insulating film functioning as a protective film that prevents short circuit between the antennas. A connecting terminal of the antenna 515 and a connecting terminal of the thin film integrated circuit 501 are required to be connected to each other. Thus, a contact hole is formed in the insulating film 518, for example, and then the connecting terminal of the antenna 515 and the connecting terminal of the thin film integrated circuit 501 are connected to each other. At this time, a conductive resin may be interposed therebetween.

Figure 8B:
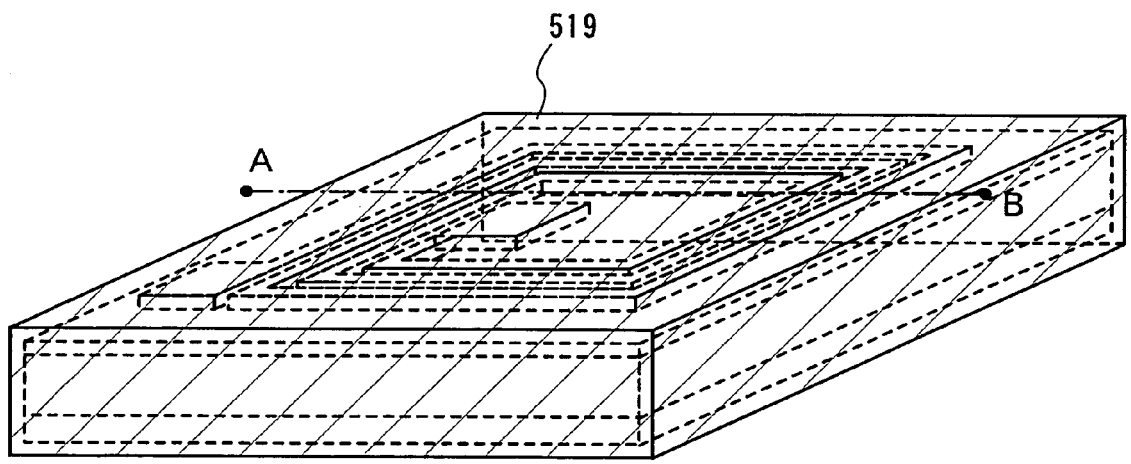

Subsequently, as shown in FIG. 8B, an insulating film 519 functioning as a protective film is formed so as to cover the thin film integrated circuit 501 and the antenna 515. The insulating film 519 can be formed similarly to the aforementioned insulating film functioning as a protective film that prevents short circuit between the antennas. By providing the insulating film 519, the thin film integrated circuit 501 can be protected from outside influences and an easily portable ID chip can be completed. The insulating film 519 can also support the function of the thin film integrated circuit 501.

Figure 9A:
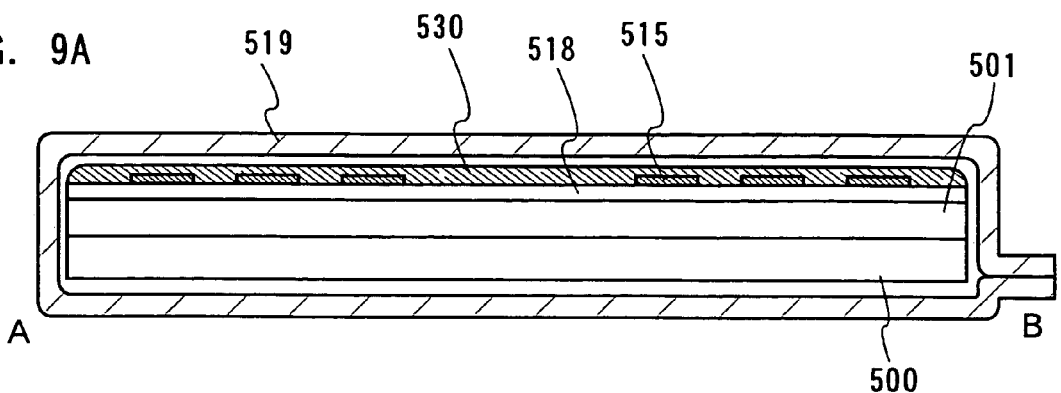
FIGS. 9A to 9C are cross sectional views of modes of an ID chip.

FIG. 9A is a cross sectional view obtained by cutting along a line A-B of FIG. 8B. The thin film integrated circuit 501, the insulating film 518, the antenna 515, and an insulating film 530 functioning as a protective film are formed in this order over the substrate 500 having an insulating surface, and the insulating film 519 is formed so as to cover these components. Although not shown, a contact hole may be formed in the insulating film 518 to connect a connecting terminal of the antenna 515 and a connecting terminal of the thin film integrated circuit 501 as described above, thereby the antenna 515 and the thin film integrated circuit 501 can be electrically connected.

When the antenna is formed over the thin film integrated circuit, miniaturization of the ID chip can be achieved.

It is also possible to complete an ID chip with different configuration than those shown in FIGS. 8A and 8B and FIG. 9A.

Figure 9B:
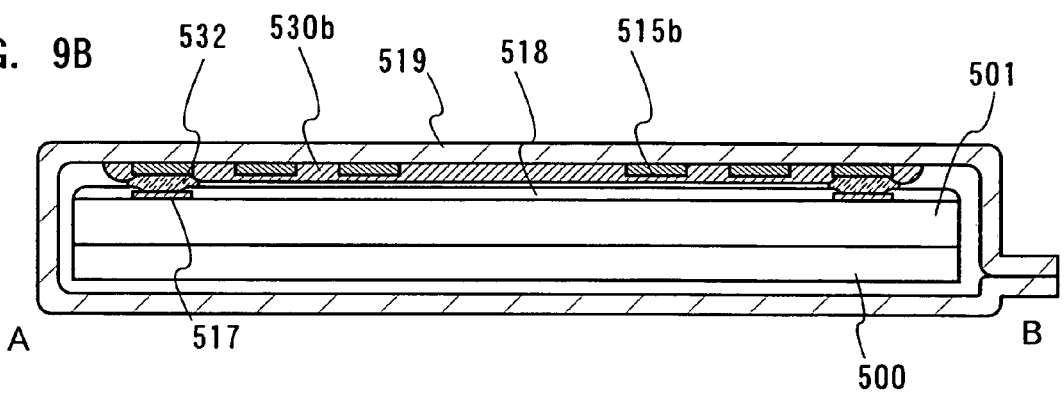

For example, as shown in FIG. 9B, an antenna 515b may be formed over the insulating film 519 side. The antenna 515b is covered with an insulating film 530b functioning as a protective film, and a contact hole is formed in an area connected to the thin film integrated circuit 501. A pad is provided as the connecting terminal 517 of the thin film integrated circuit 501, and the connecting terminal 517 can be connected to the antenna 515b through a conductive resin 532.

Thus, when the antenna 515b is formed over the insulating film 519 side to be separated from the thin film integrated circuit 501, the yield can be improved.

Figure 9C:
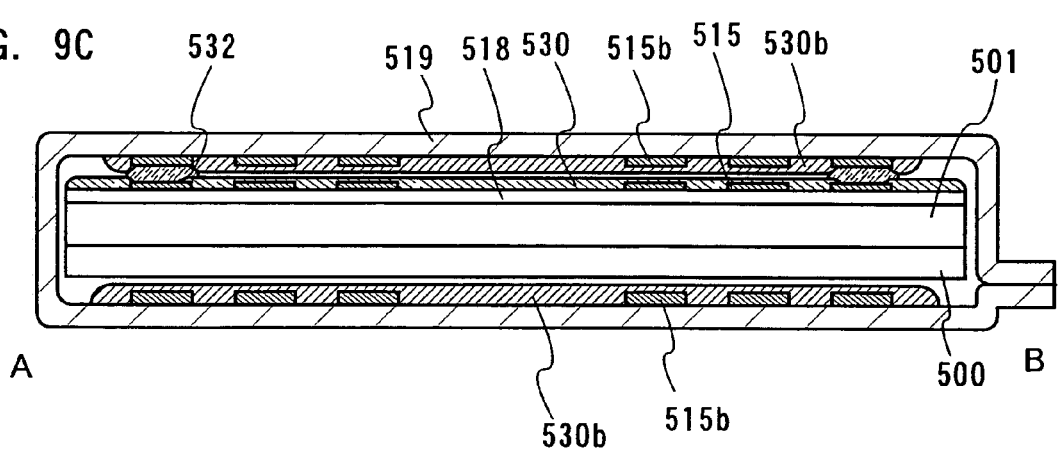

Alternatively, as shown in FIG. 9C, both of the antenna 515 over the thin film integrated circuit 501 and the antenna 515b over the insulating film 519 side may be provided. In this case, the insulating film 530 covering the antenna 515 has a contact hole in an area connected to the antenna 515b, while the insulating film 530b covering the antenna 515b has a contact hole in an area connected to the antenna 515. Thus, the antenna 515 and the antenna 515b can be connected through the conductive resin 532.

Such a configuration in which the antennas are formed in many areas can provide a highly sensitive ID chip.

Although a space is provided between the thin film integrated circuit 501 and the insulating film 519 in FIGS. 9A to 9C, the space may be filled with a resin, the insulating film 530 covering the antennas and functioning as a protective film, or the like. According to this, mechanical strength of the thin film integrated circuit 501 can be improved.

The size of such a thin film integrated circuit incorporating antennas is 5 mm square (25 mm²) or less, and preferably 0.3 mm square (0.09 mm²) to 4 mm square (16 mm²). Thus, as being drastically reduced in size, the thin film integrated circuit can be incorporated in a very small recessed portion and the like.

As set forth above, the ID chip can adopt various configurations.

Embodiment Mode 3

Described in this embodiment mode is the case of mounting an ID chip on a curved surface of a product in particular.

Figure 10A:
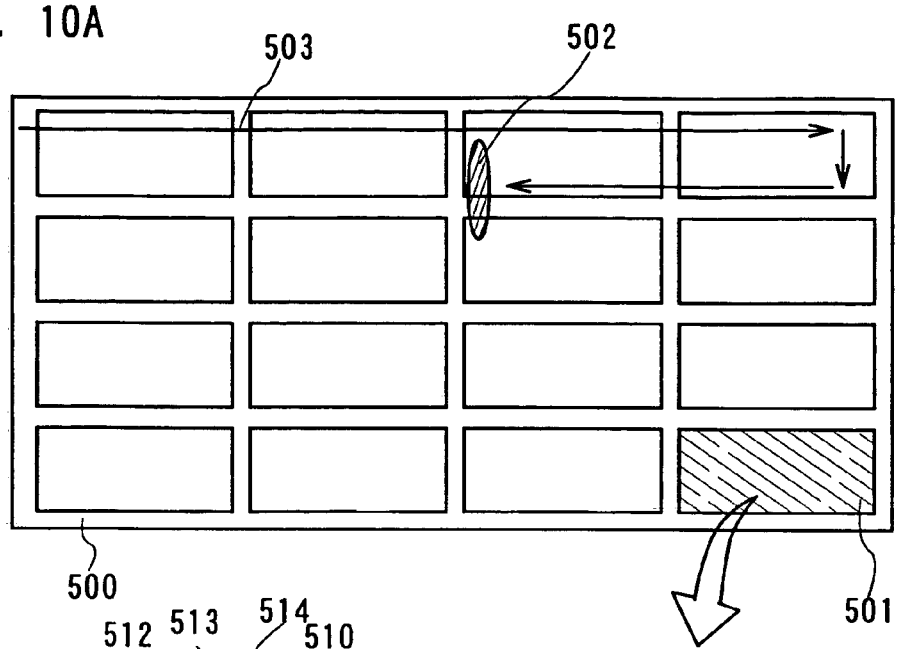
FIGS. 10A to 10D are views showing a mounting method of an ID chip.

In FIG. 10A, a plurality of thin film integrated circuits 501 are formed over the large substrate 500 having an insulating surface. Cost reduction of the ID chip can be achieved by forming a plurality of thin film integrated circuits over a large substrate, namely by a multiple pattern technology.

A semiconductor film of the thin film integrated circuit may be any one of an amorphous semiconductor, a semi-amorphous semiconductor (referred to as an SAS) having an intermediate structure between amorphous and crystalline structures, and a crystalline semiconductor. The SAS includes a microcrystalline semiconductor having crystal grains of 0.5 to 20 nm in an amorphous semiconductor. In particular, a microcrystalline state having crystal grains of 0.5 to 20 nm is called a microcrystal (μc).

In this embodiment mode, an amorphous semiconductor film is formed and crystallized by heat treatment to obtain a crystalline semiconductor film. The heat treatment can be performed by using a furnace, laser irradiation, lamp annealing using light from lamp instead of laser light, or a combination thereof.

In the case of a furnace being used, an amorphous semiconductor film is heated at a temperature of 500 to 550° C. for 2 to 20 hours. At this time, the temperature may be set in multiple stages in the range of 500 to 550° C. in order to gradually reach a higher temperature. Since hydrogen and the like of the amorphous semiconductor film are released at the first low temperature heating step, what is called a dehydrogenation can be performed to reduce film roughness in crystallization. When a metal element that accelerates crystallization, e.g., Ni is further formed over the amorphous semiconductor film, heat temperature can be preferably lowered. Even in the case of a metal element being used, heat treatment can be performed at a high temperature of 600 to 950° C.

However, a metal element may adversely affect electric characteristics of a semiconductor element, thus a gettering step is required to reduce or remove the metal element. For example, the metal element may be removed with the amorphous semiconductor film used as a gettering sink.

In the case of laser irradiation being adopted, continuous wave laser (CW laser) or pulsed laser (pulse laser) can be used. As the laser, one or more of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. The beam preferably has a linear shape and has a long axis of 200 to 350 μm in length. In addition, the laser may have an incident angle θ (0<θ<90°) relative to the semiconductor film.

Continuous wave laser light of a fundamental wave and continuous wave laser light of a harmonic may be irradiated, or continuous wave laser light of a fundamental wave and pulsed laser light of a harmonic may also be irradiated.

In the case of the pulsed laser being adopted, pulsed laser may be irradiated with such an irradiation frequency as semiconductor film is melted by a laser of a pulse and a laser of next pulse is irradiated before solidifying the semiconductor film. This gives that crystal grains that are sequentially grown in the scan direction can be obtained. That is, it is possible to use a pulsed beam with an oscillation frequency that is set so as to be smaller than the time required for a semiconductor film dissolved by the preceding beam to be solidified.

Actually used is a pulsed beam with an oscillation frequency of 10 MHz or more which is a much higher frequency than that of a few tens to a few hundreds Hz of a normally used pulsed beam.

The laser irradiation may be performed in an inert gas atmosphere such as a noble gas and nitrogen. According to this, roughness of a semiconductor surface due to laser irradiation can be suppressed, which prevents variations in threshold caused by variations in interface state density.

Alternatively, a crystalline semiconductor film may be formed directly on the surface being formed. In that case, the crystalline semiconductor film can be formed directly on the surface being formed by utilizing heat or plasma with the use of fluorine gas such as $GeF_4$ and $F_2$ and silane gas such as $SiH_4$ and $Si_2H_6$. In the case of a heat temperature being high, a high heat resistant quartz substrate may preferably be employed.

Instead, a microcrystalline semiconductor film may be formed by using $SiH_4$ and $F_2$ or $SiH_4$ and $H_2$, and then crystallized by the aforementioned laser irradiation.

In this embodiment mode, heat treatment is performed by the laser irradiation. As shown in FIG. 10A, a laser irradiated area 502 is scanned in the direction of a rectangular shape 503, thereby an amorphous semiconductor film can be crystallized entirely to obtain a crystalline semiconductor film.

Figure 10B:
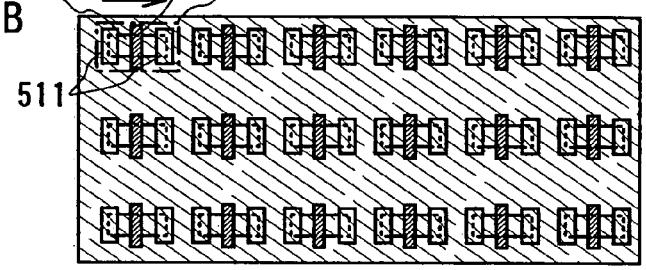

As shown in FIG. 10B, the thin film integrated circuit 501 includes a plurality of thin film transistors 510 each having a crystalline semiconductor film. Each of the thin film transistors 510 has source and drain electrodes 511, a channel forming region 512, a gate electrode 514, and the crystalline semiconductor film. The crystalline semiconductor film includes an impurity region below the source and drain electrodes 511, and the channel forming region 512 below the gate electrode 514. At this time, the source and drain electrodes 511 and the gate electrode 514 are preferably formed so that the laser scanning (irradiation) direction 503 is the same as the moving direction of carriers 513.

Figure 10C:
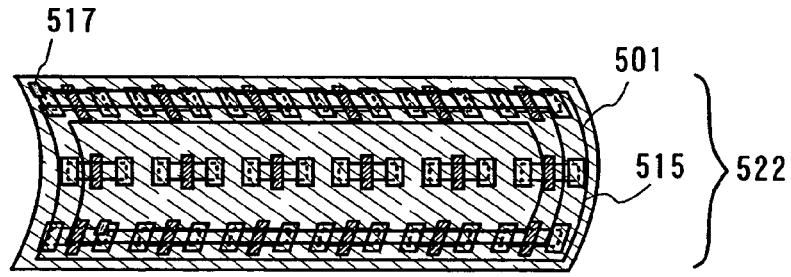

As shown in FIG. 10C, the antenna 515 and the connecting terminal 517 of the antenna are formed over the thin film integrated circuit 501 to complete the ID chip 522. Thus, a contactless ID chip incorporating an antenna can be obtained.

When bending the ID chip 522, it is desirable to bend it in the direction perpendicular to the laser scanning direction 503. That is, the ID chip 522 is bent in the direction perpendicular to the moving direction of carriers 513. Accordingly, the ID chip 522 can be bent without damaging the thin film integrated circuit, in particular thin film transistors.

Figure 10D:
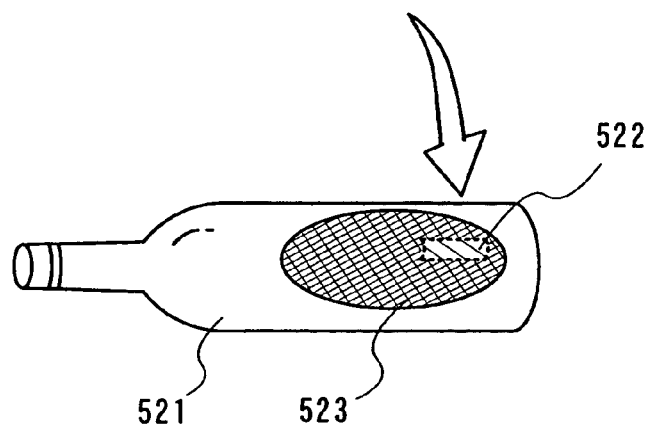

Subsequently, as shown in FIG. 10D, the ID chip 522 is attached to a product 521 having a curved surface. At this time, the ID chip 522 can be fixed with an adhesive of a label 523.

In addition, the ID chip of the present invention and the chip formed by using a silicon wafer differ from in that the semiconductor film used in the integrated circuit of the invention contains hydrogen with a density of $1\times10^{19}$ to $1\times10^{22}/cm^3$, and more preferably with a density of $1\times10^{19}$ to $5\times10^{20}/cm^3$. Defects in the semiconductor film can be reduced by hydrogen, namely, defects can be terminated. Further, flexibility of the ID chip can be increased. Instead of hydrogen, halogen may be added as well.

Accordingly, the thin film integrated circuit can be formed over a flexible substrate and bent while preventing damage of the integrated circuit.

Further in the ID chip, an area of the thin film integrated circuit occupied by the patterned semiconductor film is 1 to 30%. Therefore, the thin film transistor can be prevented from being damaged or peeled off due to bending stress.

Although the wireless ID chip incorporating an antenna is mounted in this embodiment mode, the invention can be applied to a contact ID chip or a hybrid IC chip as well. As another mounting method of the antenna, for example, a thin film integrated circuit may be transposed to a label that is used as an antenna substrate, and then mounted on a product.

Embodiment Mode 4

In this embodiment mode, a manufacturing method of a thin film integrated circuit including TFTs is specifically described with reference to FIGS. 21A to 21E, FIGS. 22A to 22D and FIGS. 23A and 23B. For simplicity, a cross sectional structure of a CPU and a memory each including an N-type TFT and a P-type TFT is shown here, and a manufacturing method thereof is explained.

Figure 21A:
FIGS. 21A to 21E are cross sectional views showing a manufacturing method of an ID chip.

First, as shown in FIG. 21A, a peeling layer 61 is formed over a substrate 60. In this embodiment mode, an a-Si film (amorphous silicon film) with a thickness of 50 nm is formed over a glass substrate (e.g., 1737 glass produced by Corning Inc.) by low pressure CVD. As the substrate 60, a quartz substrate, a substrate formed of an insulating material such as alumina, a plastic substrate with heat resistance to a process temperature in the subsequent steps, and the like can be used as well as a glass substrate.

As the peeling layer 61, it is desirable to use a film mainly containing silicon such as polycrystalline silicon, single crystalline silicon and SAS (including microcrystalline silicon) as well as amorphous silicon. However, the invention is not limited to these. The peeling layer 61 can be formed by plasma CVD, sputtering and the like as well as by low pressure CVD. A film added with an impurity such as phosphorous can also be used as the peeling layer 61. The thickness of the peeling layer 61 is preferably in the range of 30 nm to 1 µm, and even can be 30 nm or less provided that the thickness does not exceed a limiting thickness determined for the deposition apparatus.

Next, a protective film (also called a base film or a base insulating film) 55 is formed over the peeling layer 61. In this embodiment mode, the protective film 55 has a three-layer structure of a SiON film (100 nm), a SINO film (50 nm) and a SiON film (100 nm), though materials, film thickness and the number of layers are not limited to the above. For example, instead of the SiON film in the bottom layer, an organic material such as siloxane with a thickness of 0.5 to 3 µm may be formed by spin coating, slit coating, droplet ejection and the like. Alternatively, a silicon nitride film (SiN, $Si_3N_4$ and the like) may also be employed. Each film preferably has a thickness of 0.05 to 3 µm, and the film thickness can be determined arbitrarily within this range.

Note that in the case of a material mainly containing silicon such as a-Si being used as the peeling layer 61 and an island-like semiconductor film 57, a protective film that is in contact with them is preferably formed of $SiO_xN_y$ in view of the adhesiveness.

A silicon oxide film can be formed by thermal CVD, plasma CVD, atmospheric pressure CVD, bias ECR CVD and the like using a mixed gas such as $SiH_4$ and $O_2$ or TEOS (tetraethoxysilane) and $O_2$. A silicon nitride film can be typically formed by plasma CVD using a mixed gas of $SiH_4$ and $NH_3$. A SiON film or a SiNO film can be typically formed by plasma CVD using a mixed gas of $SiH_4$ and $N_2O$.

Figure 21B:
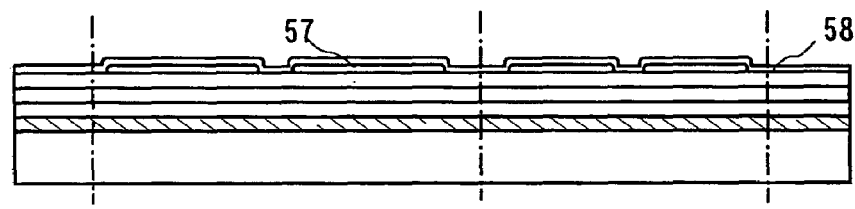

Subsequently, as shown in FIG. 21B, the island shaped semiconductor film 57 is formed on the protective film 55. The island-like semiconductor film 57 is formed of an amorphous semiconductor, a crystalline semiconductor or an SAS (including microcrystalline silicon), each of which mainly contains silicon, silicon germanium (SiGe) or the like.

In this embodiment mode, an amorphous semiconductor film is formed and crystallized by heat treatment to obtain a crystalline semiconductor film. As other manufacturing methods of a semiconductor film, the description in Embodiment Mode 3 can be referred to.

The heat treatment of the semiconductor film is considered to affect the peeling layer. For example, when the heat treatment is performed by furnace annealing or laser irradiation with a wavelength of 532 nm, energy reaches the peeling layer in some cases, thereby the peeling layer is also crystallized at a time. Such a crystallized peeling layer can improve the reaction rate.

On the other hand, in order to effectively crystallize the semiconductor film, the protective film can be formed to have a structure that prevents the energy of laser from reaching the peeling layer. For example, materials, film thickness and laminate order of the protective film are selected.

Note that hydrogen or halogen with a density of $1 \times 10^{19}$ to $1 \times 10^{22}$ atoms·cm$^{-3}$, and more preferably with a density of $1 \times 10^{19}$ to $5 \times 10^{20}$ atoms·cm$^{-3}$ may be added to a channel forming region of a TFT in particular. When the SAS is used, the density of hydrogen or halogen is desirably in the range of $1 \times 10^{19}$ to $2 \times 10^{21}$ atoms·cm$^{-3}$. In either case, a larger amount of hydrogen or halogen than that in an IC chip formed over a silicon wafer is desirably contained. According to this, cracks locally generated in a TFT can be terminated by hydrogen or halogen.

Then, as shown in FIG. 21B, a gate insulating film 58 is formed over the island shaped semiconductor film 57. The gate insulating film 58 is formed of one or more layers of silicon nitride, silicon oxide, silicon nitride oxide, and silicon oxynitride by plasma CVD, sputtering or the like. In the case of laminating, a three-layer structure is preferably used, in which a silicon oxide film, a silicon nitride film and a silicon oxide film are laminated in this order over the substrate.

Figure 21C:
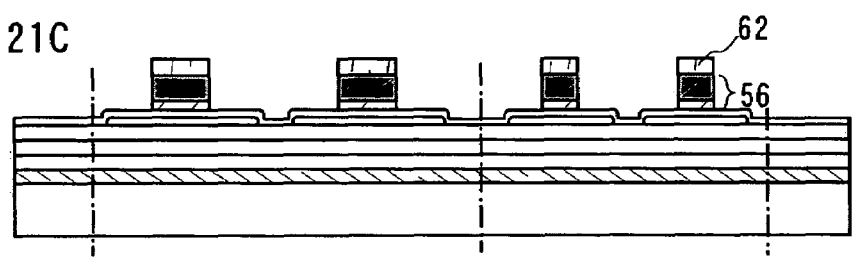

Subsequently, as shown in FIG. 21C, a gate electrode 56 is formed. In this embodiment mode, Si and W (tungsten) are laminated by sputtering and then etched with a resist 62 used as a mask to obtain the gate electrode 56. It is needless to say that materials, structure and manufacturing method of the gate electrode 56 are not limited to this and can be selected arbitrarily. For example, Si doped with an N-type impurity and NiSi (nickel silicide) may be laminated, or TaN (tantalum nitride) and W (tungsten) may be laminated. Alternatively, a single layer structure can also be adopted by using various conductive materials.

Instead of the resist mask, a mask containing an inorganic material such as $SiO_x$ (called a hard mask) may be used as well. In that case, a step of patterning the hard mask such as $SiO_x$ and SiON is additionally required. However, the hard mask is reduced at a lower rate than the resist mask in etching, thus the gate electrode layer with a predetermined width can be formed. Alternatively, the gate electrode 56 may be selectively formed by droplet ejection without using the resist 62.

The gate electrode 56 and an antenna can be formed at a time. In that case, materials are selected taking into consideration functions of the gate electrode 56 and the antenna.

As an etching gas for etching the gate electrode 56, a mixed gas of $CF_4$, $Cl_2$ and $O_2$, or a $Cl_2$ gas can be employed, though the invention is not limited to this.

Figure 21D:
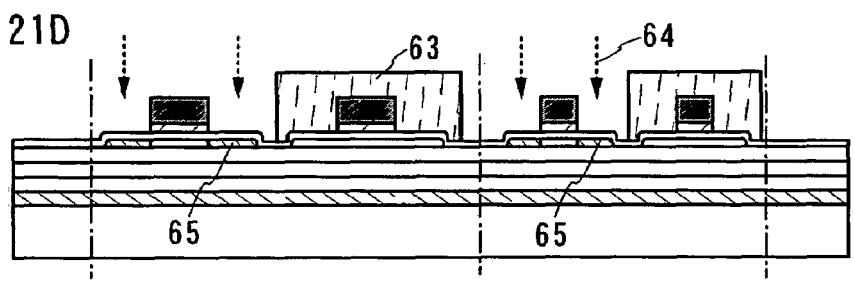

As shown in FIG. 21D, while covering with a resist 63 each region to be P-type TFTs 70 and 72, an impurity element 64 that imparts N-type conductivity (typically, P (phosphorous) or As (arsenic)) is added to the island shaped semiconductor films of N-type TFTs 69 and 71 at a low concentration using the gate electrodes as masks (first doping step). The conditions of the first doping step are a dosage of $1 \times 10^{13}$ to $6 \times 10^{13}$/cm$^2$ and an acceleration voltage of 50 to 70 keV, however, the invention is not limited to these. In the first doping step, doping is performed through the gate insulating film 58

(through doping), thereby a pair of low concentration impurity regions 65 are obtained. Note that the first doping step may be performed entirely without covering the P-type TFT regions.

Figure 21E:
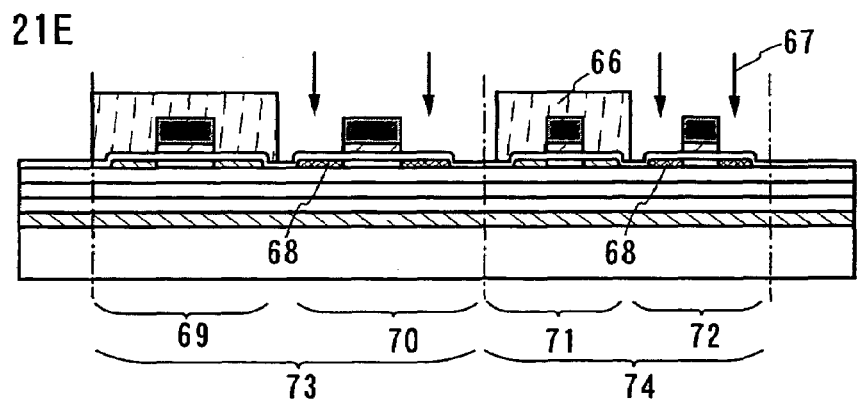

Next, as shown in FIG. 21E, after the resist 63 is removed by ashing and the like, another resist 66 is formed to cover the N-type TFT regions. Then, an impurity element 67 that imparts P-type conductivity (typically, B (boron)) is added to the island shaped semiconductor films of the P-type TFTs 70 and 72 at a high concentration using the gate electrodes as masks (second doping step). The conditions of the second doping step are a dosage of $1\times10^{16}$ to $3\times10^{16}/cm^2$ and an acceleration voltage of 20 to 40 keV. In the second doping step, through doping is performed through the gate insulating film 58, thereby a pair of P-type high concentration impurity regions 68 are obtained.

Figure 22A:
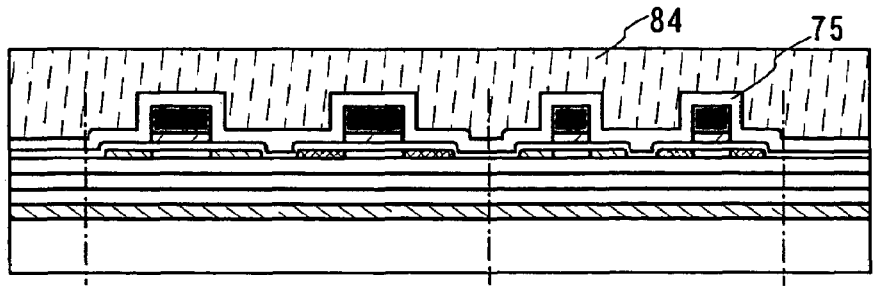
FIGS. 22A to 22D are cross sectional views showing a manufacturing method of an ID chip.

After the resist 66 is removed by ashing and the like as shown in FIG. 22A, an insulating film 75 is formed so as to cover the gate electrodes and the like. As the insulating film 75, a $SiO_2$ film with a thickness of 100 nm is formed by plasma CVD.

Figure 22B:
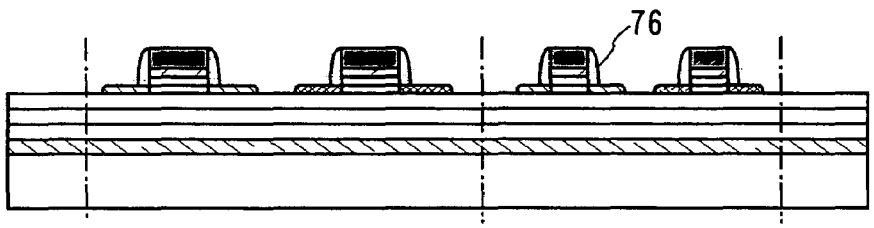

Then, as shown in FIG. 22B, the substrate is entirely covered with a resist 84, and the resist 84, the insulating film 75 and the gate insulating film 58 are etched and removed by etch back, thereby a side wall 76 is formed in a self-aligned manner. As the etching gas, a mixed gas of $CHF_3$ and He is employed. Note that forming steps of the side wall 76 are not limited to these.

In the case of an insulating film being formed over the back side of the substrate in the formation of the insulating film 75, the insulating film over the back side may preferably be etched and removed using the resist 84 as a mask (back side processing).

Figure 23A:
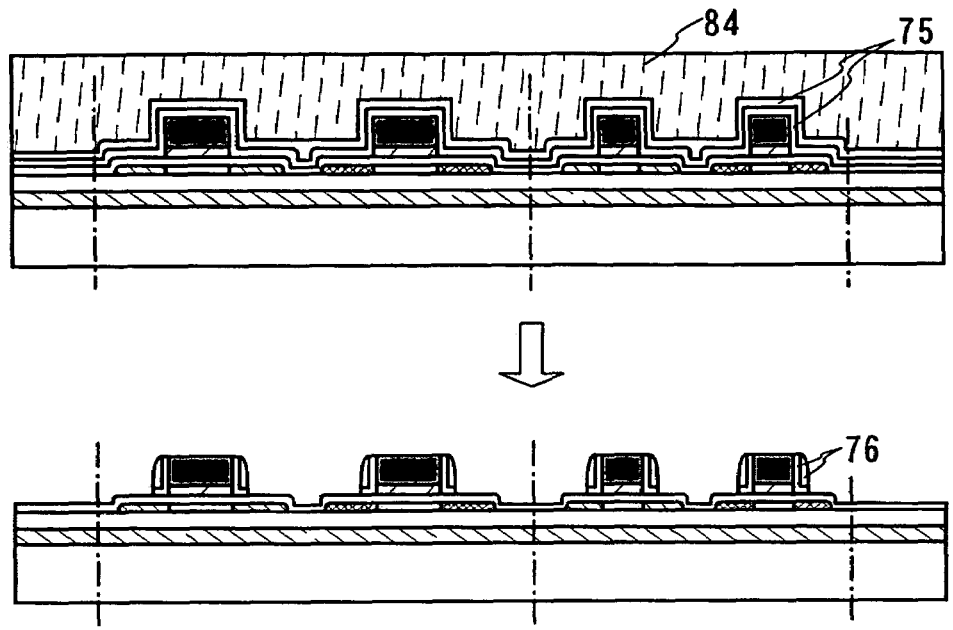
FIGS. 23A and 23B are cross sectional views showing a manufacturing method of an ID chip.

Steps for forming the side wall 76 are not limited to the aforementioned ones. For example, the side wall 76 can be formed by steps shown in FIGS. 23A and 23B. FIG. 23A shows an example of the insulating film 75 having two or more laminated layers. In this embodiment mode, the insulating film 75 has two laminated layers of a SiON (silicon oxynitride) film with a thickness of 100 nm and an LTO (Low Temperature Oxide) film with a thickness of 200 nm. The SiON film is formed by plasma CVD whereas the LTO film is formed of $SiO_2$ film by low pressure CVD. Then, etch back is performed using the resist 84 as a mask, thereby the side wall 76 with an L-shape and a circular arc can be obtained.

Figure 23B:
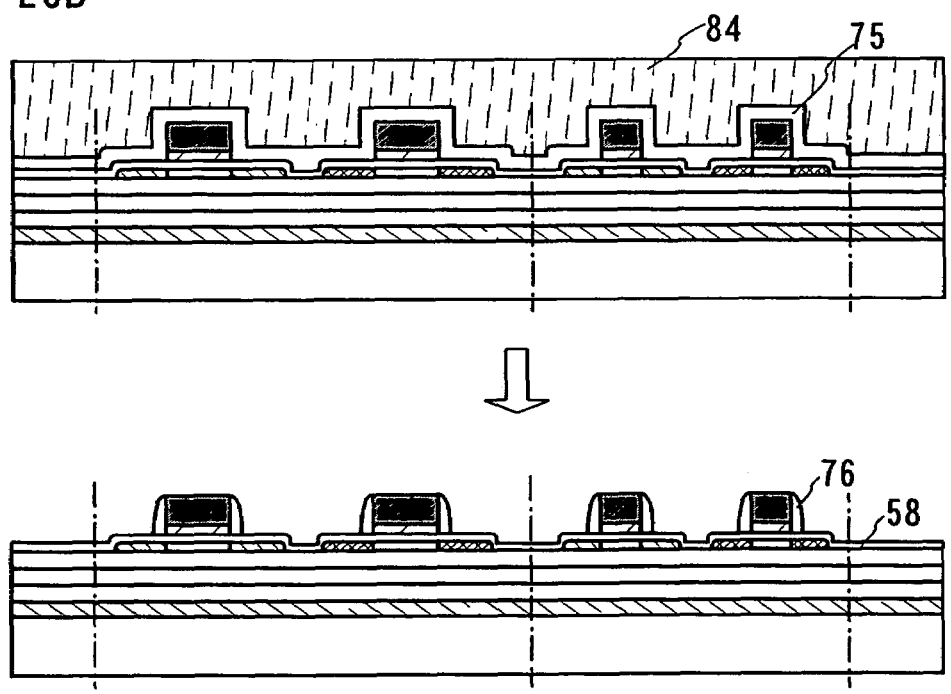

FIG. 23B shows an example in which etch back is performed while leaving the gate insulating film 58. In that case, the insulating film 75 may have either a single layer structure or a laminated layer structure.

The side wall 76 functions as a mask when a low concentration impurity region or a non-doped offset region is formed under the side wall 76 by adding an N-type impurity at a high concentration in the subsequent step. In any one of the aforementioned steps for forming the side wall 76, the conditions of the etch back may be changed depending on the width of the low concentration impurity region or the offset region.

Figure 22C:
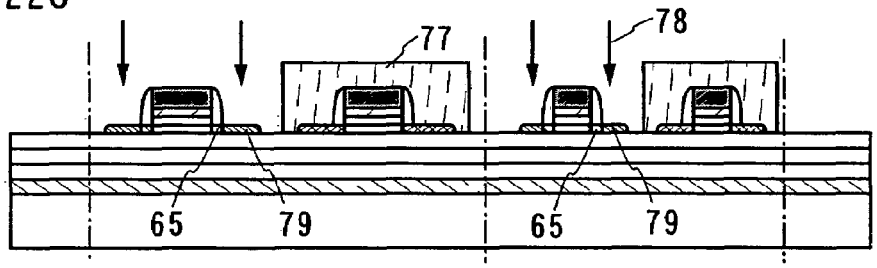

Next, as shown in FIG. 22C, another resist 77 is formed to cover the P-type TFT regions, and an impurity element 78 that imparts N-type conductivity (typically, P or As) is added at a high concentration using the gate electrode 56 and the side wall 76 as masks (third doping step). The conditions of the third doping step are a dosage of $1\times10^{13}$ to $5\times10^{15}/cm^2$ and an acceleration voltage of 60 to 100 keV. In the third doping step, through dope is performed through the gate insulating film 57, thereby a pair of N-type high concentration impurity regions 79 are formed.

Note that the impurity regions may be heat activated after removing the resist 77 by ashing and the like. For example, a SiON film may be formed to have a thickness of 50 nm and then heat treated under a nitrogen atmosphere at a temperature of 550° C. for four hours. Further, when a $SiN_x$ film containing hydrogen is formed to have a thickness of 100 nm and heat treated under a nitrogen atmosphere at a temperature of 410° C. for one hour, defects of the crystalline semiconductor film can be improved. This step is called a hydrogenation step by which dangling bonds in the crystalline semiconductor film can be terminated. In addition, a SiON film with a thickness of 600 nm is formed as a cap insulating film to protect the TFTs. Note that the hydrogenation step may be performed after the formation of the SiON film. In that case, a $SiN_x$ film and a SiON film can be formed sequentially. Thus, a three-layer insulating film of SiON, $SiN_x$ and SiON is formed over the TFTs, the structure and the material of which are not limited to the aforementioned ones. These insulating films are preferably formed since they also have a function to protect the TFTs.

Figure 22D:
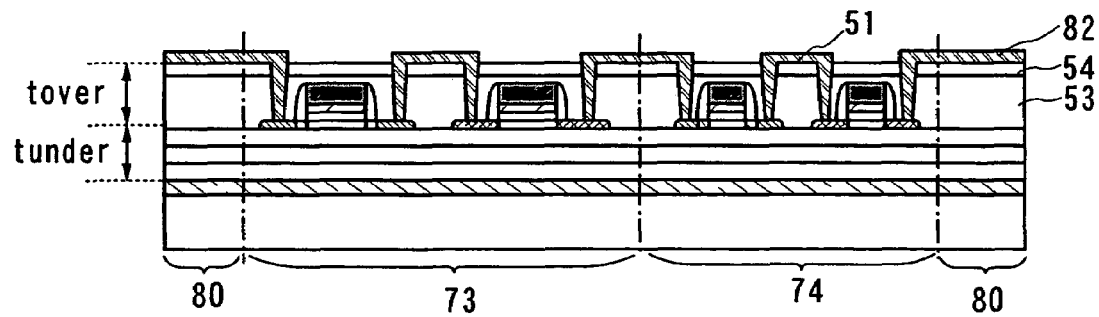

Subsequently, an interlayer film 53 is formed over the TFTs as shown in FIG. 22D. As the interlayer film 53, polyimide, acryl, polyamide or a heat resistant organic resin such as siloxane can be used. The interlayer film 53 can be formed, depending on the material thereof, by spin coating, dip coating, spray coating, doctor knife, roll coater, curtain coater, or knife coater, or droplet ejection such as ink jet printing, screen printing and offset printing. Alternatively, an inorganic material may also be used, such as silicon oxide, silicon nitride, silicon oxynitride, PSG (Phosphorous Glass), BPSG (Boron Phosphorous Glass), and alumina. Note that these insulating films may be laminated to form the interlayer film 53.

In addition, a protective film 54 may be formed over the interlayer film 53. The protective film 54 can be formed of a film containing carbon such as DLC (Diamond Like Carbon) and carbon nitride (CN), a silicon oxide film, a silicon nitride film, a silicon nitride oxide film or the like by plasma CVD, atmospheric pressure CVD and the like. Instead, a photosensitive or non-photosensitive organic material such as polyimide, acryl, polyamide, resist, and benzocyclobutene, or a heat resistant organic resin such as siloxane may be employed as well.

A filler may be mixed into the interlayer film 53 or the protective film 54 in order to prevent these films from being peeled off or cracked due to stress caused by the difference in thermal expansion coefficient between the interlayer film 53 or the protective film 54 and a conductive material and the like constituting a wiring that is formed later.

Then, after forming a resist, a contact hole is formed by etching to form a wiring 51 for connecting the TFTs and a connecting wiring 82 connected to an external antenna. At this time, by ink jet printing or laser cutting described in Embodiment Mode 6, different connecting wirings can be formed in the memory portion depending on the application.

Although a mixed gas of $CHF_3$ and He is used as an etching gas for forming the contact hole, the invention is not limited to this. The wiring 51 and the connecting wiring 82 may be formed simultaneously by using the same material, or may be formed separately. In this embodiment mode, the wiring 51 connecting the TFTs is formed by sputtering and then patterned to have a five-layer structure of Ti, TiN, Al—Si, Ti, and TiN.

When Si is mixed into the Al layer, occurrence of hillocks in resist baking during wiring patterning can be prevented. Instead of Si, 0.5% of Cu may be mixed as well. The occurrence of hillocks can be further suppressed by sandwiching the Al—Si layer between Ti and TiN. Note that, it is desirable to use the aforementioned hard mask formed of SiON and the like in patterning. The material and forming method are not limited to these, and the aforementioned materials used for the gate electrode may also be adopted.

Although this embodiment mode shows the case in which the TFT regions constituting a CPU 73, a memory 74 and the like are integrally formed with terminal portions 80 connected to an antenna, the constitution and the like of the TFTs according to this embodiment mode can be applied to the case of integrally forming the TFT regions and the antenna. In that case, the antenna may preferably be formed over the interlayer film 53 or the protective film 54 and covered with another protective film. The antenna can be formed of a conductive material such as Ag, Au, Al, Cu, Zn, Sn, Ni, Cr, Fe, Co, and Ti, or an alloy including at least one of them, however, the invention is not limited to this. The wiring and the antenna may be formed of different materials. Note that the wiring and the antenna are preferably formed of a malleable and ductile metal material, and more preferably, formed to be thick enough to withstand deformation stress.

In order to form the antenna, it may be formed over the entire surface by sputtering and then patterned using a resist mask, or it may be formed selectively by droplet ejection and the like using a nozzle. The wiring and the antenna may be formed simultaneously, or one of them may be formed first and then the other may be formed so as to overlap each other.

Through the aforementioned steps, a thin film integrated circuit constituted by TFTs is completed. Top gate TFTs are formed in this embodiment mode, though bottom gate (inversely staggered) TFTs may be adopted as well.

As shown in FIG. 22D, it is desirable to adjust the thickness of the protective films or the interlayer films of the upper and bottom layers in a thin film integrated circuit device so that the distance ($t_{under}$) between the semiconductor film of the TFT and the bottom layer of the protective film may be equal to or substantially equal to the distance ($t_{over}$) between the semiconductor film and the upper layer of the interlayer film (or the protective film if provided). When the semiconductor film is disposed at the center of the thin film integrated circuit device in this manner, stress on the semiconductor film can be buffered and occurrence of cracks can be prevented.

After that, the peeling layer is removed to peel off the substrate. As an etchant for removing the peeling layer, a gas or a liquid containing fluorine halide is used. More specifically, $ClF_3$ (chlorine trifluoride) can be used as fluorine halide. In this manner, an ID chip can be completed. Further, the ID chip may be transposed to a flexible substrate in order to increase mechanical strength of the ID chip.

Embodiment Mode 5

Described in this embodiment mode is the use a product mounting an ID chip, in particular the use of securities mounting ID chips.

Figure 19A:
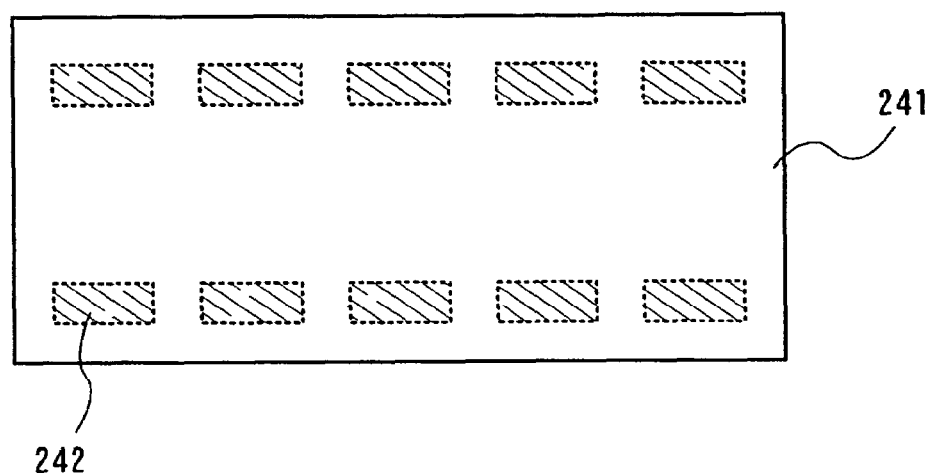
FIGS. 19A and 19B are diagrams showing modes of the use of products each mounting an ID chip.

One product may be provided with one or more ID chips. When a plurality of ID chips are provided, a high security product can be achieved. FIG. 19A shows a security 241 mounting 10 ID chips 242. Each of the ID chips 242 may have the same data or different data. In the case of data of the ID chips 242 being the same, correct data can be provided continuously even when one ID chip is damaged. Meanwhile, in the case of data of the ID chips 242 being different, the security 241 can be accepted as a legitimate product only when data of the ID chips 242 is all agreed. In other words, the more ID chips are mounted on a product, the higher the security is. Further, when the arrangement of the ID chips is specified, it can be determined whether the arrangement of all the ID chips is agreed or not.

Figure 19B:
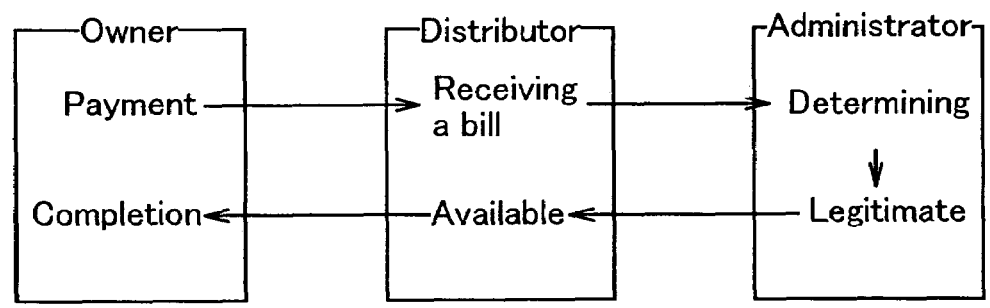

For example, when an owner of securities uses a security mounting an ID chip for payment as shown in FIG. 19B, a distributor receives the security and puts it into a cash register or the like. Then, data of the ID chip is transferred via Internet to an administrator of securities, more specifically a management server. The management server determines whether the data of the ID chip is correct or not, and informs the result. For example, when the result that the data of the ID chip is correct is informed, the security can be used at the distributor, thereby the payment of the owner is completed.

Figure 20:
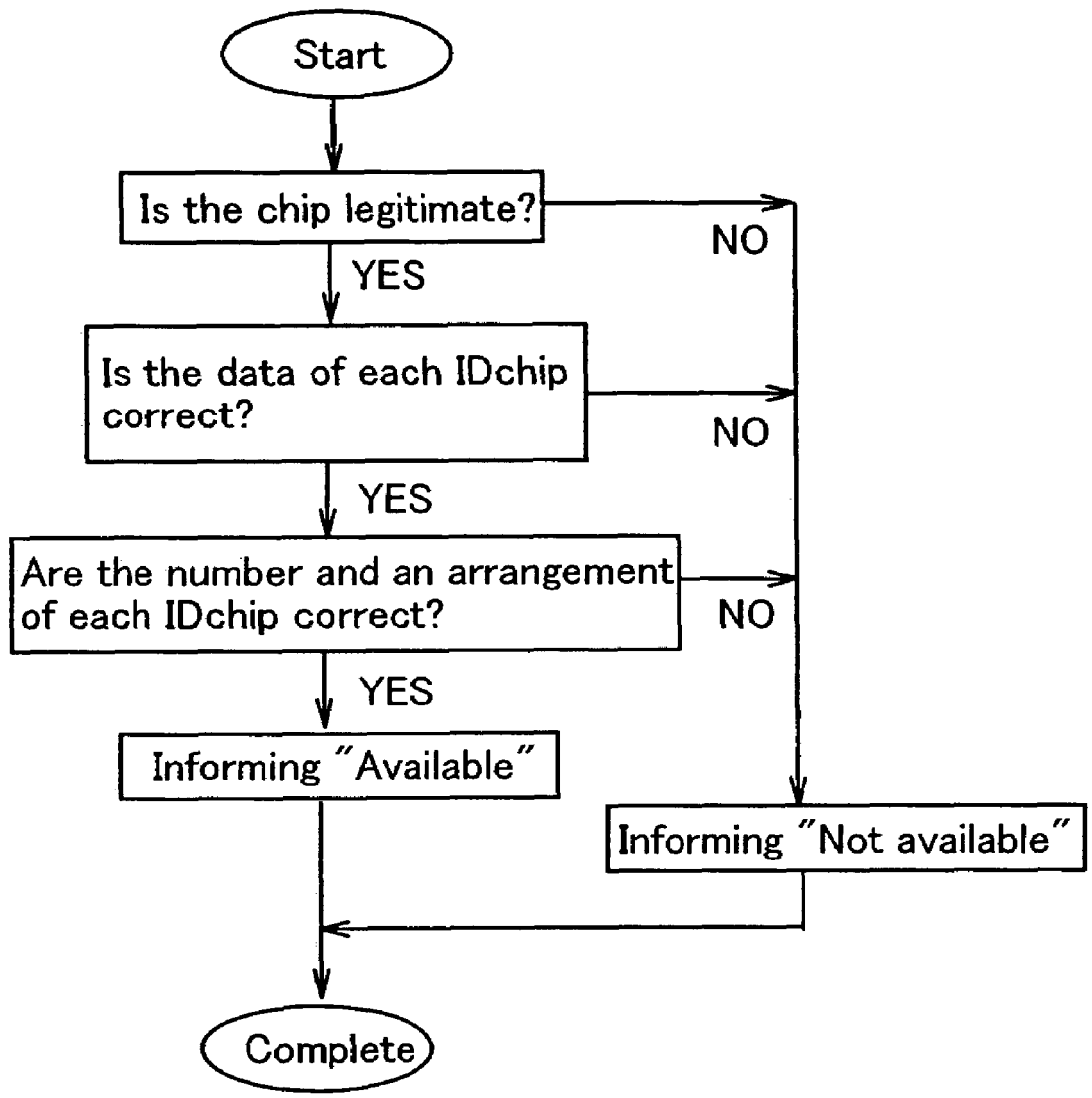
FIG. 20 is a flow chart for determining whether products each mounting an ID chip have validity or not.

FIG. 20 is a flowchart illustrating a procedure that is performed by the administrator, more specifically the management server, for determining whether the data of the ID chip is correct or not.

In the management server, it is determined first whether the ID chip is legitimate or not. When the ID chip is determined to be legitimate, it is further determined whether the data of the ID chip is correct or not. When the data of the ID chip is determined to be correct, it is determined whether the number and arrangement of the ID chip are correct or not. As a result, permitted use of products such as securities each mounting the ID chip determined to be correct is informed to the distributor. As for other products such as securities, prohibited use of them is informed to the distributor.

In this manner, the ID chip can prevent abuse of products such as securities.

Instead of Internet, an electronic apparatus inputted with data of the ID chip can be used for determining whether the data of the ID chip is correct or not. When an electronic apparatus of a distributor is used, the use of securities can be determined in a short time.

In the case of bills each mounting an ID chip being used in a vending machine or the like, for example, the vending machine may be equipped with a means for determining whether data of the ID chip is correct or not. In the current vending machine, crumpled bills cannot be determined to be legitimate or not, and thus cannot be used in some cases. When the bills mount the ID chip, it is expected that the bills can be determined to be legitimate or not regardless of the conditions thereof.

Note that the number and arrangement of ID chips to be mounted on a product are not exclusively limited. For example, a plurality of ID chips may be disposed at random.

Figure 26:
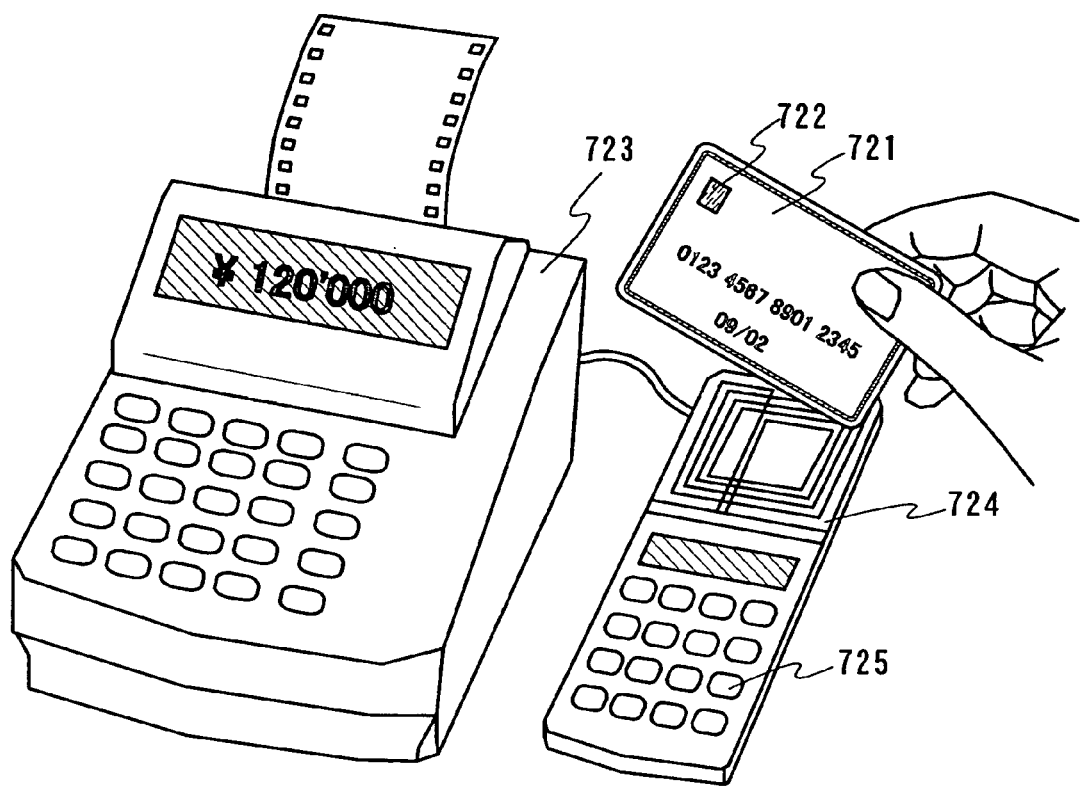
FIG. 26 is a view of a product mounting an ID chip.

Described hereinafter is the case in which a card mounting the ID chip of the invention is used as electronic money. In FIG. 26, a card 721 is used to make payment. The card 721 mounts an ID chip 722 of the invention. FIG. 26 also shows a cash register 723 and a reader/writer 724. The ID chip 722 stores data of the amount available on the card 721, and the data of the amount can be read wirelessly by the reader/writer 724 and transferred to the cash register 723. The cash register 723 verifies that the amount to be paid is available on the card 721, and thus payment is made. Then, data of remainder of the money after the payment is transferred to the reader/writer 724, and written to the ID chip 722 of the card 721 by the reader/writer 724.

Note that the reader/writer 724 may be equipped with a key 725 for inputting a personal identification number and the like, thereby the card 721 can be prevented from being used by a third party without notice.

Embodiment Mode 6

Described in this embodiment mode are a circuit configuration and a manufacturing method of an ID chip having a non-volatile and non-rewritable ROM as a memory.

The ID chip of the invention having the most simple circuit configuration includes, for example, an RF circuit, a power source circuit, a clock generator circuit, and a ROM for storing identification data, and has only a function of individual identification while utilizing network technologies such as Internet to compensate for the lack of functions. Meanwhile, the ID chip having a complex circuit configuration additionally includes, for example, a CPU and a congestion control circuit for individually identifying a plurality of ID chips within the same radio wave spectrum, and incorporates a security function and a processing function.

Figure 11:
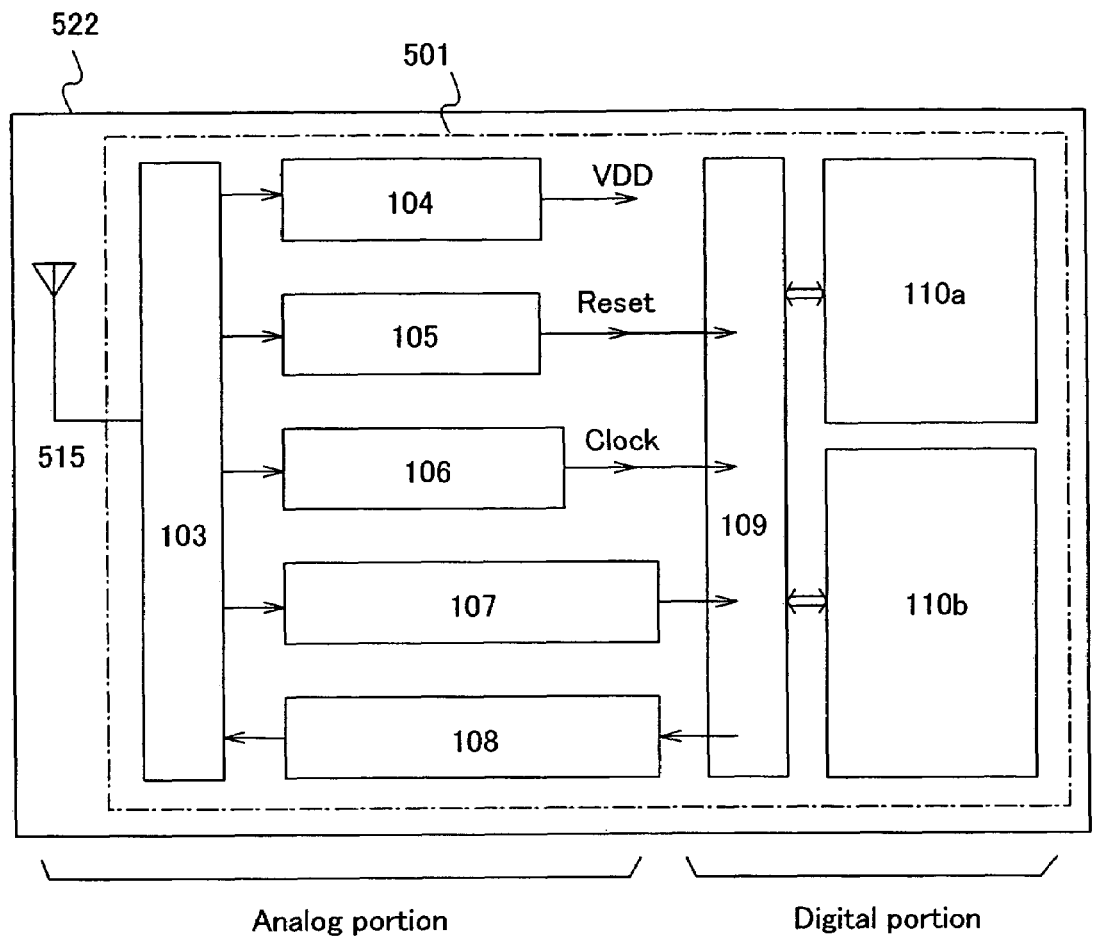
FIG. 11 is a diagram showing a circuit configuration of an ID chip.

FIG. 11 is a typical block diagram of the ID chip having a non-volatile and non-rewritable ROM as a memory. Shown in FIG. 11 is a simple configuration having a function to read only fixed data such as identification data. In FIG. 11, an ID chip 522 includes an antenna 515, an RF circuit 103, a power source circuit 104, a reset circuit 105, a clock generator circuit 106, a data demodulation circuit 107, a data modulation circuit 108, a control circuit 109, a first ROM 110a, and a second ROM 110b.

The aforementioned circuits and ROMs can be integrally formed on an insulating surface as the thin film integrated circuit 501. An antenna 515 can be formed over the thin film integrated circuit 501 on the insulating surface, or formed over another substrate, namely an antenna substrate.

As the substrate having an insulating surface, a glass substrate such as barium borosilicate glass and alumino borosilicate glass, a quartz substrate, a stainless substrate and the like can be employed. It is more preferable to use a plastic substrate typified by polyethylene terephthalate (PET), polyethylene naphthalate (PEN) and polyether sulfone (PES), or a substrate formed of a synthetic resin such as acryl. The substrate formed of a synthetic resin is flexible and light weight.

The surface of the substrate is preferably polished by CMP (Chemical Mechanical Polishing) in order to improve the flatness. Used as a polishing material for CMP is, for example, a slurry in which fumed silica particles obtained by thermally decomposing silicon chloride gas are dispersed in a KOH solution.

Alternatively, the thin film integrated circuit can be formed on an insulating surface over such as a glass substrate, and then transposed to a substrate formed of a synthetic resin. In that case, the thin film integrated circuit can be formed without taking into consideration the heat resistance of the substrate formed of a synthetic resin. The thin film integrated circuit may also be transposed to an antenna substrate. Note that the thin film integrated circuit can be peeled off by a method using stress, a method of removing a peeling layer by laser irradiation or etching, a method of removing a substrate, or the like. In addition, the thin film integrated circuit can be transposed to the substrate formed of a synthetic resin or the antenna substrate with an adhesive such as a UV curing resin, more specifically an epoxy resin or a resin additive, or an adhesive such as a two-sided tape. Accordingly, a flexible, light weight and thin ID chip can be obtained. Since such an ID chip is resistant to stress, it can be mounted on various products.

In particular, sheet products such as bills are often touched by hand, therefore, diffusion of alkali metal such as Na becomes a problem. Thus, in order to prevent impurities from diffusing into the thin film integrated circuit, the thin film integrated circuit may preferably be covered with an insulating film containing resin or nitrogen. For example, an insulating film containing nitrogen (SiN, SiON, SiNO, or lamination of them and $SiO_2$) may be used as a base film of the thin film integrated circuit. Further, an insulating film containing nitrogen is preferably formed so as to cover a wiring and the like. In other words, thin film transistors are preferably sandwiched between insulating films containing nitrogen.

The first ROM 110a is a mask ROM constituted by a first memory cell and stores "data common to substrates". Meanwhile, the second ROM 110b is a ROM constituted by a second memory cell and stores "data different between substrates".

The first memory cell and the second memory cell that store different data have different design rules in many cases. Therefore, each ROM is preferably formed by respective different manufacturing steps.

For example, in addition to steps using a photomask, ink jet printing or laser cutting can be used for forming the ROMs.

More specifically, it is preferably that the first memory cell is formed by photolithography and the second memory cell is formed by ink jet printing or laser cutting in order to achieve different layouts for each substrate. In particular, in the second memory cell, a metal wiring for connecting circuits can be formed by ink jet printing, and a metal wiring can be cut by laser cutting.

As the result of using different manufacturing steps, memory cells with improved frequency characteristics and operating margin can be obtained.

The first memory cell and the second memory cell are formed of different ROMs in this embodiment mode, though the invention is not limited to this. In the case where one of the two memory cells requires a small number of unit memory cells, the two memory cells are preferably formed of the same ROM in view of the area efficiency.

Explanation is made on each circuit. The RF circuit 103 receives an analog signal from the antenna 515 and outputs from the antenna 515 an analog signal received from the data modulation circuit 108. The power source circuit 104 generates a constant power source from a received signal. The reset circuit 105 generates a reset signal while the clock generator circuit 106 generates a clock signal. The data demodulation circuit 107 extracts data from a received signal. The data modulation circuit 108 generates an analog signal to be outputted to the antenna 515 or changes the antenna properties based on a digital signal received from the control circuit 109. Such circuits constitute an analog portion.

The control circuit 109 receives and reads data extracted from a received signal. Specifically, the control circuit 109 generates an address signal of the first ROM 110a and the second ROM 110b and a ROM selection signal, reads data, and transfers the read data to the data modulation circuit 108. The control circuit 109, the first ROM 110a and the second ROM 110b constitute a digital portion.

Since the first ROM 110a stores data independent of the substrate, it may be formed by photolithography. For example, in the case where data is determined by connecting wirings through a contact hole formed in an insulating film by photolithography, a memory cell layout as shown in FIG. 12A can be adopted.

Figure 12A:
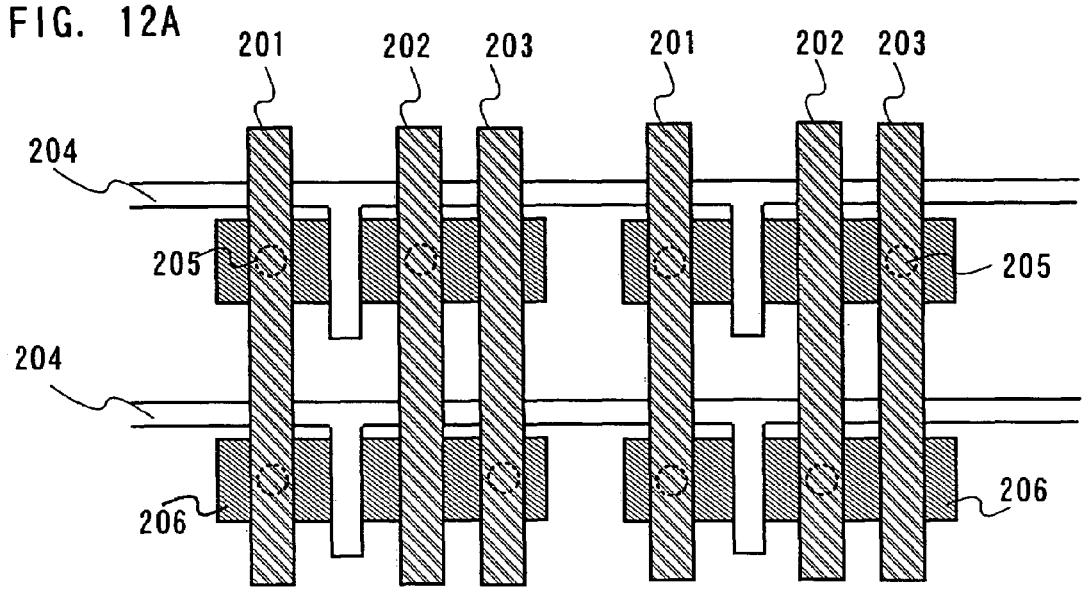
FIGS. 12A to 12C are diagrams showing a configuration of an ID chip.

FIG. 12A shows four memory cells each of which includes a bit line 201, a VDD 202, a GND 203, a word line 204, and a semiconductor film 206. In the layout of a mask ROM when determining data by connecting wirings through a contact hole formed in an insulating film by photolithography, the bit line 201 overlaps one of two high concentration impurity regions of a thin film transistor (TFT) constituting the memory cell, while the VDD 202 and the GND 203 overlap the other thereof. Since the bit line 201 is a data read path, it is short-circuited (also refer to as "connected") the semiconductor film 206 through a contact hole 205.

For example, on the assumption that data is 0 in the case of a read potential being GND while data is 1 in the case of a read potential being VDD, whether data is 0 or 1 can be determined in accordance with whether the contact hole 205 is formed in the VDD 202 or the GND 203 since both of the VDD 202 and the GND 203 overlap one of the two high concentration impurity regions of the TFT. In other words, when 0 is stored as data, the contact hole 205 is formed in the GND 203 to be short-circuited to the semiconductor film 206, meanwhile, when 1 is stored as data, the contact hole 205 is formed in the VDD 202 to be short-circuited to the semiconductor film 206.

It is needless to say that data can be determined in a wring step or a patterning step of a semiconductor film. In the first ROM 110a, a step for determining data content is performed by photolithography.

On the other hand, in the second ROM 110b, instead of photolithography, ink jet printing or laser cutting may preferably be adopted in a step for forming different circuit connections of memory cells in each substrate. In the case of ink jet printing being adopted, for example, a drawing program may be prepared for a layout as shown in FIG. 12B.

Figure 12B:
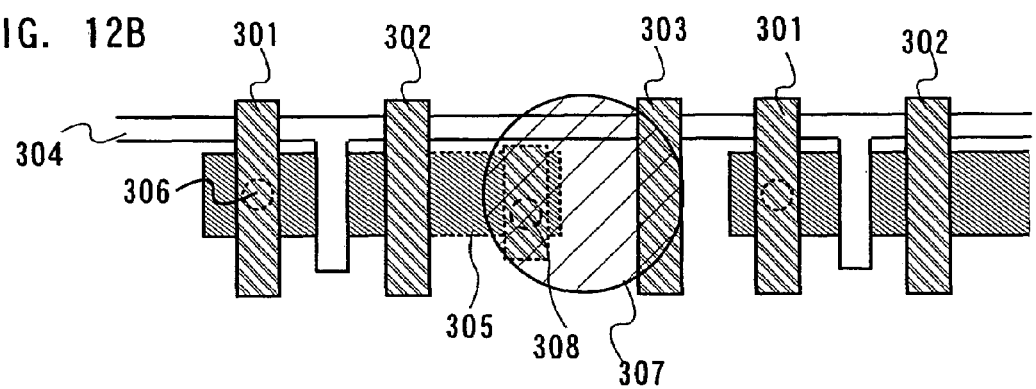

FIG. 12B shows a memory cell layout for ink jet printing. One memory cell includes a bit line 301, a VDD 302, a GND 303, a word line 304, and a semiconductor film 305. In the case of data being determined by ink jet printing, the bit line 301 as a data read path, which overlaps one of two high concentration impurity regions of a TFT, has a contact hole 306 and is short-circuited to the semiconductor film 305. On the other hand, the VDD 302 and the GND 303 are not short-circuited to the semiconductor film 305, though a contact hole 308 is formed in the other of the two high concentration impurity regions of the TFT.

For example, it is assumed that data is 0 in the case of a read potential being GND while data is 1 in the case of a read potential being VDD. As shown in FIG. 12B, one of the two high concentration impurity regions of the TFT structuring a memory cell, which is not short-circuited to the bit line 301, is short-circuited to a metal wiring of the GND 303 with a metal wiring 307 using ink jet printing. As a result, the data can be set to 0.

Meanwhile, in the case of data of a memory cell being set to 1, one of the two high concentration impurity regions of the TFT structuring the memory cell, which is not short-circuited to the bit line 301, is short-circuited to a metal wiring of the VDD 302 with the metal wiring 307 using ink jet printing. As a result, the data can be set to 1.

Data of a metal wiring drawn by ink jet printing may be entered into the drawing program in advance. Accordingly, predetermined data of each substrate can be stored only by changing a part of the drawing program, and a photomask used for photolithography can be prevented from being thrown away after being used only once. Note that it is important to design entire circuits so as to satisfy the design rule and limitation suitable for ink jet printing.

When ink jet printing is used, an insulating film is not required to be formed and a metal wiring can be drawn selectively. Thus, a contact hole is not necessarily provided.

Alternatively, a contact hole may be formed by ink jet printing during a step for forming different circuit connections of memory cells.

Figure 12C:
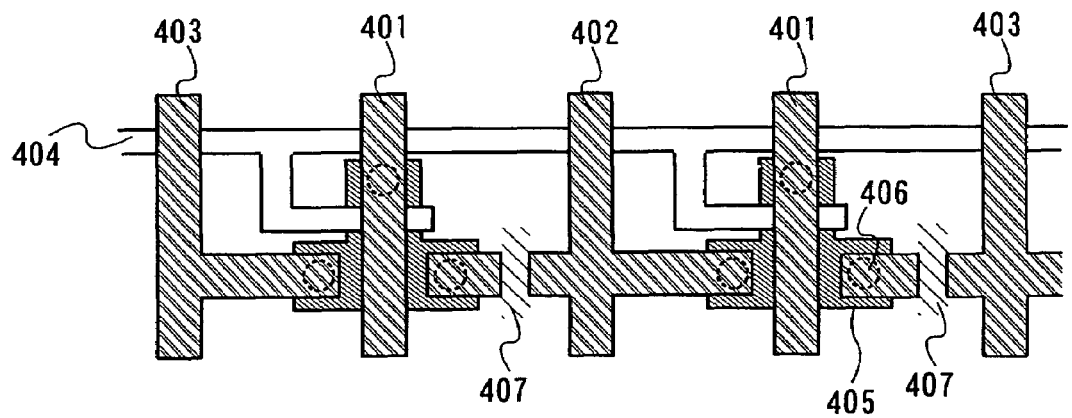

In the case of laser cutting being adopted, a layout as shown in FIG. 12C is formed for example. One memory cell includes a bit line 401, a VDD 402, a GND 403, a word line 404, and a semiconductor film 405. In the case of data being determined by laser cutting, the bit line 401 as a data read path, which overlaps one of two high concentration impurity regions of a TFT, has a contact hole 406 and is short-circuited to the semiconductor film. On the other hand, both of the VDD 402 and the GND 403 are short-circuited to the other of the two high concentration impurity regions of the TFT.

For example, it is assumed that data is 0 in the case of a read potential being GND while data is 1 in the case of a read potential being VDD. When memory cell data is set to 0, a metal wiring of the VDD 402 connected to one of the two high concentration impurity regions of the TFT constituting the memory cell is cut by laser cutting. As a result, only the GND 403 is short-circuited to the one of the two high concentration impurity regions of the TFT, thereby the memory content is set to 0.

Meanwhile, when memory cell data is set to 1, a metal wiring of the GND 403 connected to the other of the two high concentration impurity regions of the TFT constituting the memory cell is cut by laser cutting. As a result, only the VDD 402 is short-circuited to the other of the two high concentration impurity regions of the TFT, thereby the memory content is set to 1.

Data of a metal wiring to be cut by laser cutting may be entered into the program in advance. Accordingly, predetermined data of each substrate can be stored by laser cutting after formation of a TFT, and a photomask used for photolithography can be prevented from being thrown away after being used only once. Needless to say, it is important to design entire circuits so as to satisfy the design rule and limitation suitable for laser cutting.

In order to form different connections of memory cells in each substrate, both of ink jet printing and laser cutting may be adopted in the manufacturing steps of the second ROM.

By determining data in ROMs as described above, it is possible to prevent a photomask from being thrown away after being used only once and to provide an ID chip at low cost.

Figure 13A:
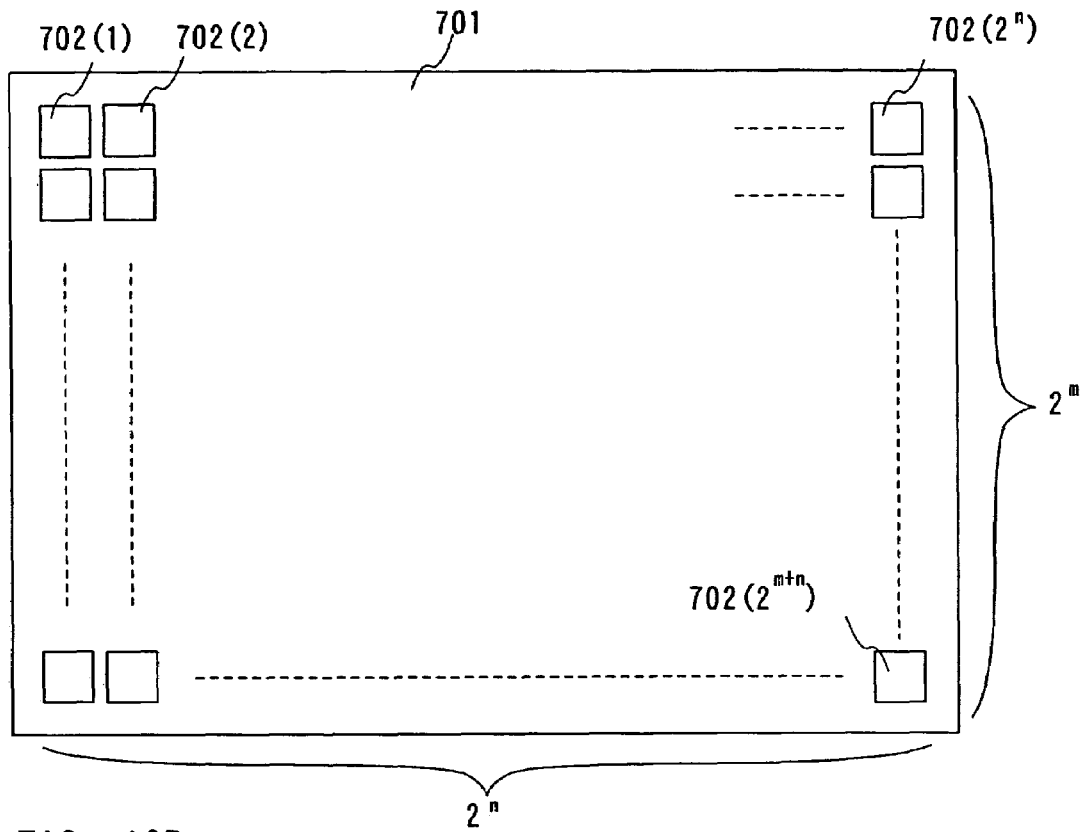
FIGS. 13A to 13C are diagrams showing a method of manufacturing a plurality of ID chips.

FIG. 13A shows an example of a glass substrate 701 that includes $2^{m+n}$ ID chips 702 arranged in $2^m$ columns and $2^n$ rows (m and n are positive integers). Each of the ID chips 702 is sequentially assigned a number of 702 (1), 702 (2), . . . , and 702 ($2^{m+n}$).

Figure 13B:
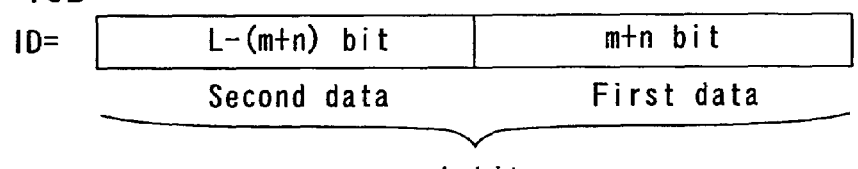

It is assumed that each of the ID chips includes L-bit identification serial data as shown in FIG. 13B. The lower m+n bits represent first data common to substrates, which is stored in the first ROM and whose data content is determined by a step using a photomask. Meanwhile, the upper L−(m+n) bits represent second data different between substrates, which is stored in the second ROM and whose data content is determined by ink jet printing or laser cutting.

Figure 13C:
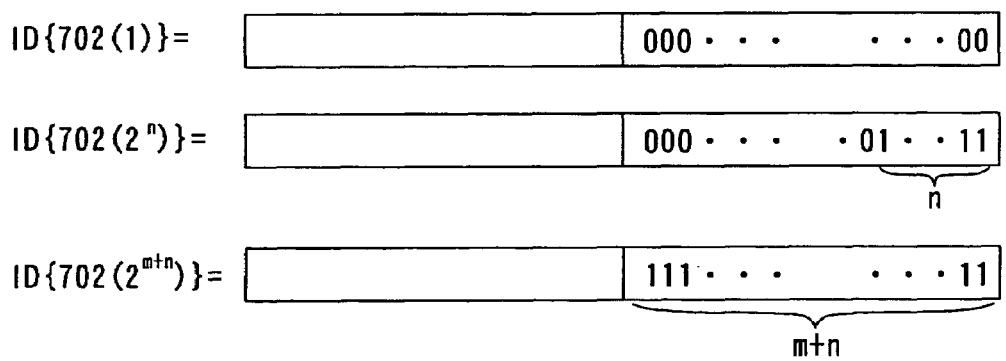

FIG. 13C shows the first data content of the lower bits. The data common to substrates has to be different between chips in each substrate, thus (m+n)-bit area is required. On the assumption that the content of the first data in the N-th chip is ID {702 (N)}, ID {702 (N)}=N−1 is satisfied, and it can be expressed in binary form corresponding to the data content of a ROM as shown in FIG. 13C.

Note that although one substrate includes $2^{m+n}$ ID chips 702 in this embodiment mode, the invention is not limited to this.

Embodiment Mode 7

Described in this embodiment mode are a circuit configuration and a manufacturing method of an ID chip using fingerprint. The use of the fingerprint can realize a memory that stores random fixed data by utilizing variations in characteristics of TFTs. Note that variations in characteristics of TFTs include variations due to grain patterns of a crystalline semiconductor film forming an active layer of a TFT and process variations (film thickness, film quality, impurity concentration and the like). A non-volatile memory that has the same circuit configuration and layout and stores random fixed data whenever it is manufactured even by using the same step is referred to as a random number ROM.

Figure 14:
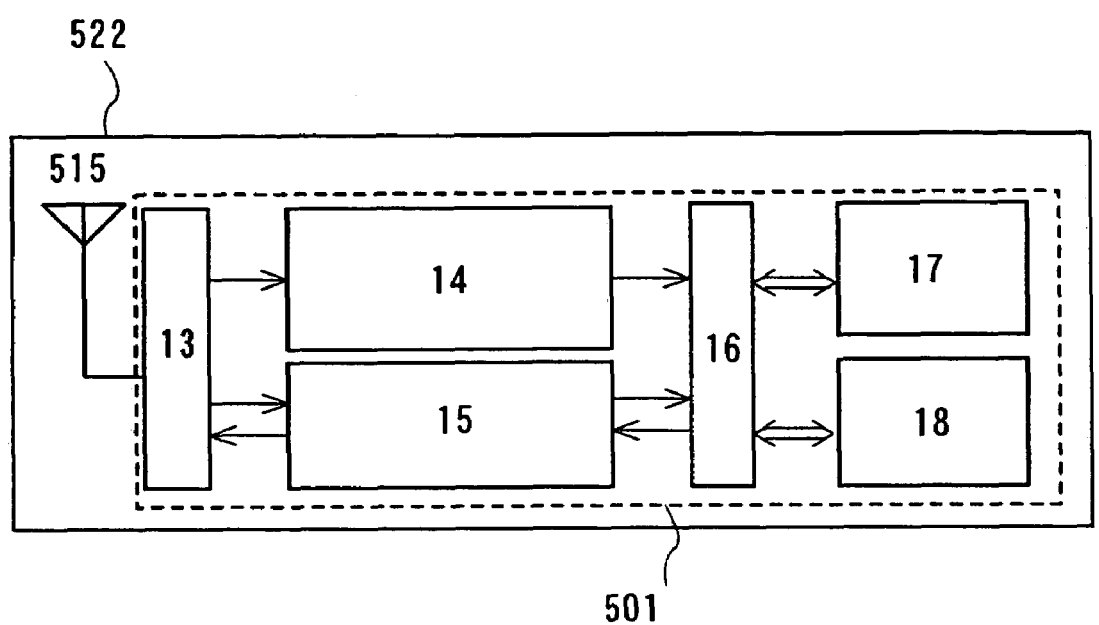
FIG. 14 is a diagram showing a circuit configuration of an ID chip.

FIG. 14 is a block diagram showing a simple configuration example of an ID chip using fingerprint. Shown in FIG. 14 is a contactless ID chip incorporating an antenna, which has a function to read fixed data such as an identification number. Even when the ID chip has only a function to read fixed data such as an identification number, it can be applied to various fields by utilizing network technologies such as Internet to compensate for the lack of functions.

As shown in FIG. 14, an ID chip 522 includes an antenna 515, an RF circuit 13, a power source/clock signal/reset signal generating circuit 14, a data demodulation/modulation circuit 15, a control circuit 16, a mask ROM 17, and a random number ROM 18.

The circuits and ROMs shown in FIG. 14 can be integrally formed on an insulating surface as the thin film integrated circuit 501. The substrate having an insulating surface can be formed with reference to the aforementioned embodiment mode. Similarly to the aforementioned embodiment mode, the antenna 515 can be formed over the thin film integrated circuit 501 on the insulating surface or formed over another substrate, namely an antenna substrate. In addition, this embodiment mode can be implemented in combination with the method of peeling off and transposing the thin film integrated circuit described in the aforementioned embodiment mode.

Explanation is made on each circuit. The RF circuit 13 receives an analog signal from the antenna 515 and outputs from the antenna 515 an analog signal received from the data demodulation/modulation circuit 15. The power source/clock signal/reset signal generating circuit 14 generates a constant power source, a reset signal and a clock signal from a received signal. The data demodulation/modulation circuit 15 extracts data from a received signal and converts a digital signal received from the control circuit 16 into an analog signal to be outputted to the antenna 515.

The control circuit 16 controls the mask ROM 17 and the random number ROM 18 and reads data in accordance with a received signal that is demodulated. More specifically, the control circuit 16 generates an address signal and an enable signal of the mask ROM 17 and the random number ROM 18, reads data, and transfers the read data to the data demodulation/modulation circuit 15.

The random number ROM 18 is a memory circuit that has the same circuit configuration and layout and stores random fixed data whenever it is manufactured by the same step. The random number ROM 18 can be used as a ROM for storing specific data of each ID chip (identification number and the like). Configurations of the random number Rom are described below with reference to FIGS. 15A to 15C and FIG. 16.

Figure 15A:
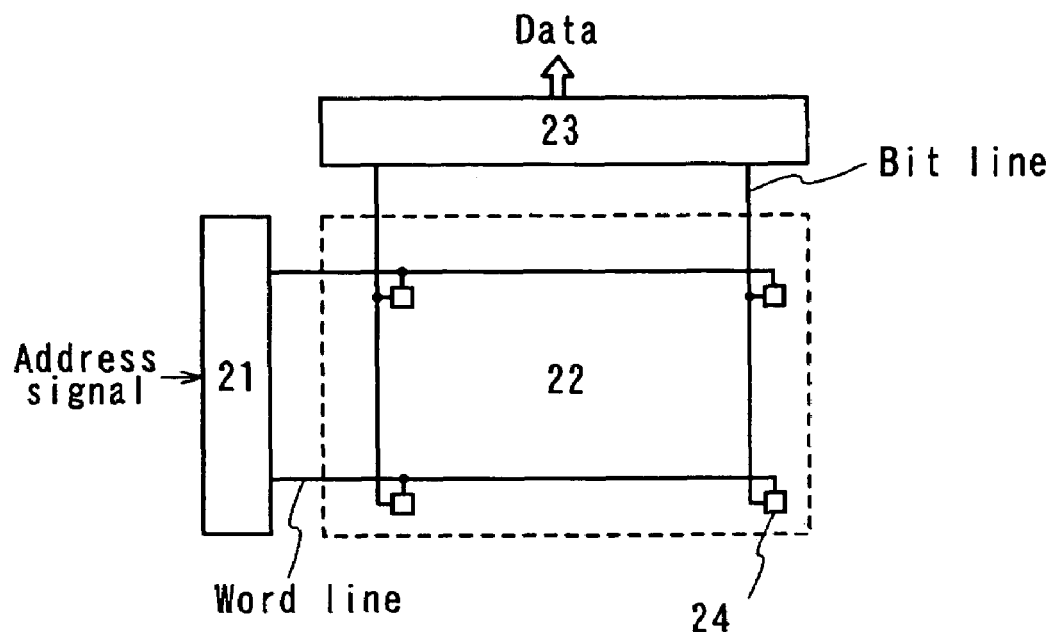
FIGS. 15A to 15C are diagrams showing a configuration of an ID chip.

FIG. 15A shows a typical configuration example of a random number ROM. A random number ROM in FIG. 15A includes a decoder 21, a memory cell array 22, and a reading circuit 23. The decoder 21 receives an address signal and selects a word line corresponding to the address. The memory cell array 22 includes memory cells 24 arranged in matrix. The memory cells 24 in the same row are connected to the same word line while the memory cells 24 in the same column are connected to the same bit line. The memory cell 24 is selected through the word line and data of the memory cell 24 is read through the bit line. The reading circuit 23 selects the bit line and amplifies the potential of the bit line, thereby data is read.

Figure 15B:
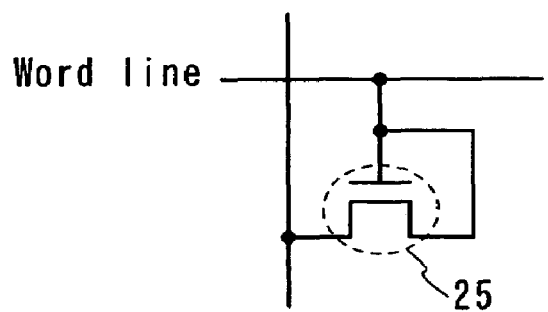
Figure 15C:
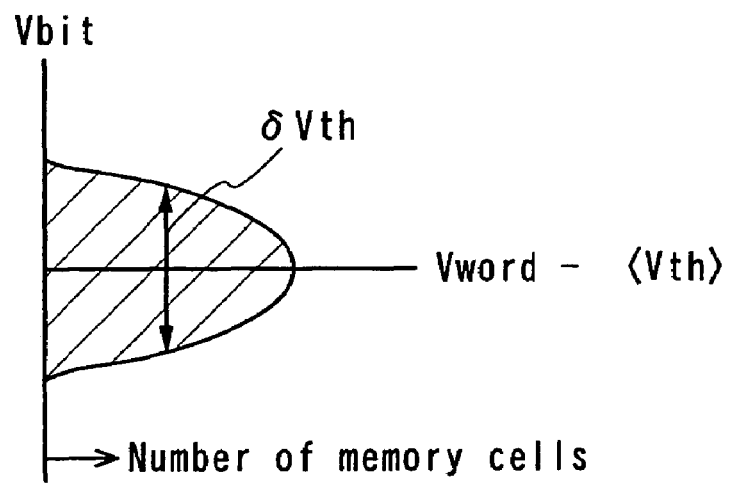

FIG. 15B shows a memory cell example configuring a random number memory. A memory cell includes a TFT 25 one of a source electrode and a drain electrode of which is connected to a bit line, and the other and a gate electrode of which are connected to a word line. When a voltage Vword higher than a threshold voltage Vth of the TFT 25 is applied to the word line in such a memory cell, a potential (Vword−Vth) is applied to the bit line. The threshold voltage of a TFT has a variation due to grain patterns and process variations. Therefore, on the assumption that the threshold voltage has a variation δVth, an analog potential is applied to the bit line in accordance with a distribution shown in FIG. 15C. As a result, the memory cell outputs a random potential based on variations in the threshold voltage of a TFT.

Figure 16:
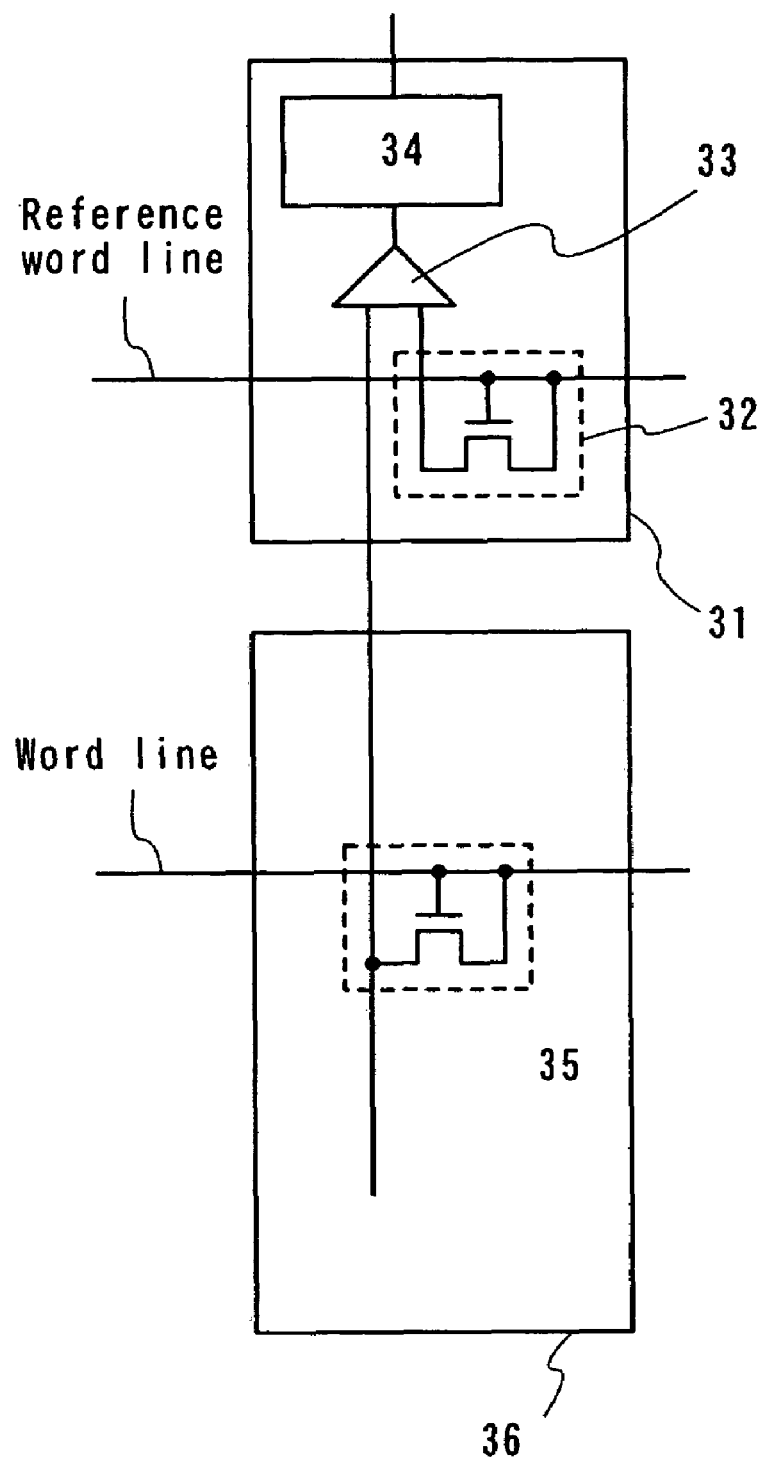
FIG. 16 is a diagram showing a configuration of an ID chip.

FIG. 16 shows a circuit configuration example of the reading circuit, which corresponds to a column of memory cells. A reading circuit 31 includes a reference memory cell 32, a differential amplifier circuit 33, and a latch circuit 34. When a word line is selected, a potential Vbit is applied to a bit line by a memory cell 35 in a memory cell array 36. On the other hand, a reference potential Vref is outputted from the reference memory cell 32. The potential Vbit and the reference potential Vref are compared and amplified in the differential amplifier circuit 33, and stored in the latch circuit 34.

Note that the reference potential Vref is preferably close to the average of the bit line potential applied by the memory cell. According to this, 0 or 1 is assigned to data of the memory cell in each column of memory cells with a probability of ½, thereby uniform random numbers are generated. For example, it can be achieved by increasing the channel width of a TFT constituting the reference memory cell.

In this manner, in accordance with a difference between the threshold voltage of a TFT constituting the reference memory cell 32 and the threshold voltage of a TFT constituting the selected memory cell 35, a random number of one bit is determined and stored in the latch circuit 34. To be more exact, a random number is determined taking into consideration variations of a TFT constituting the differential amplifier circuit 33. In either case, a random number is determined in accordance with variations in characteristics of TFTs. Thus, a random number ROM storing random fixed data can be obtained even when the same manufacturing steps are adopted.

Note that the aforementioned random number ROM can be formed by a normal TFT manufacturing technology, and formed by the same process as that for forming other integrated circuits.

Accordingly, the random number ROM can be formed without increase in cost, and can be formed at a lower process cost as compared with a flash memory.

Note that since a value is stored in the random number ROM at random, the probability that the same ID is stored in different ID chips is not zero. However, for example, a capacity of about 128 bits can have $2^{128}$ random numbers. Therefore, the probability that the same random number is stored in different ID chips is substantially zero, which cannot be a problem.

When such a random number ROM is used for storing specific data of an ID chip (identification number and the like), it is possible to prevent a photomask needed for forming a mask ROM from being thrown away after being used only once and to provide an ID chip at low cost without increase in process cost.

Shown in FIGS. 15A to 15C and FIG. 16 is the random number ROM that determines data by comparing each memory cell with the reference memory cell, though the random number ROM can determine data by comparing potentials of adjacent memory cells. For example, when a memory cell in a memory cell array is selected, a potential corresponding to the threshold voltage of a TFT constituting each memory cell is applied to a bit line, and potential difference between adjacent two bit lines is amplified in a differential amplifier circuit to store data in a latch circuit. Such a random number ROM has a circuit configuration capable of making efficient use of area, though there is a probability that a non-uniform random number is generated.

An ID chip having only a function to read fixed data such as an identification number is only required to have data of a small capacity. For example, an ID chip with a capacity of 128 bits is enough to have a specific identification number. In such a case, memory cells constituting a random number ROM are not necessarily arranged in matrix, and an initial value of a shift register can be given.

Figure 17A:
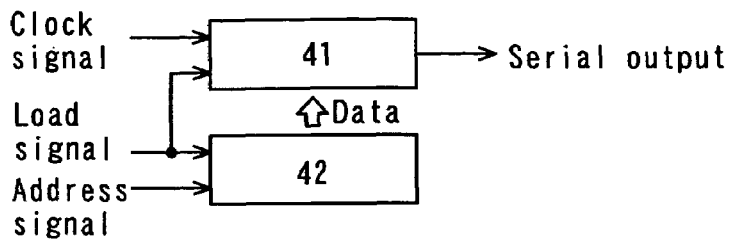
FIGS. 17A to 17C are diagrams showing a configuration of an ID chip.
Figure 17B:
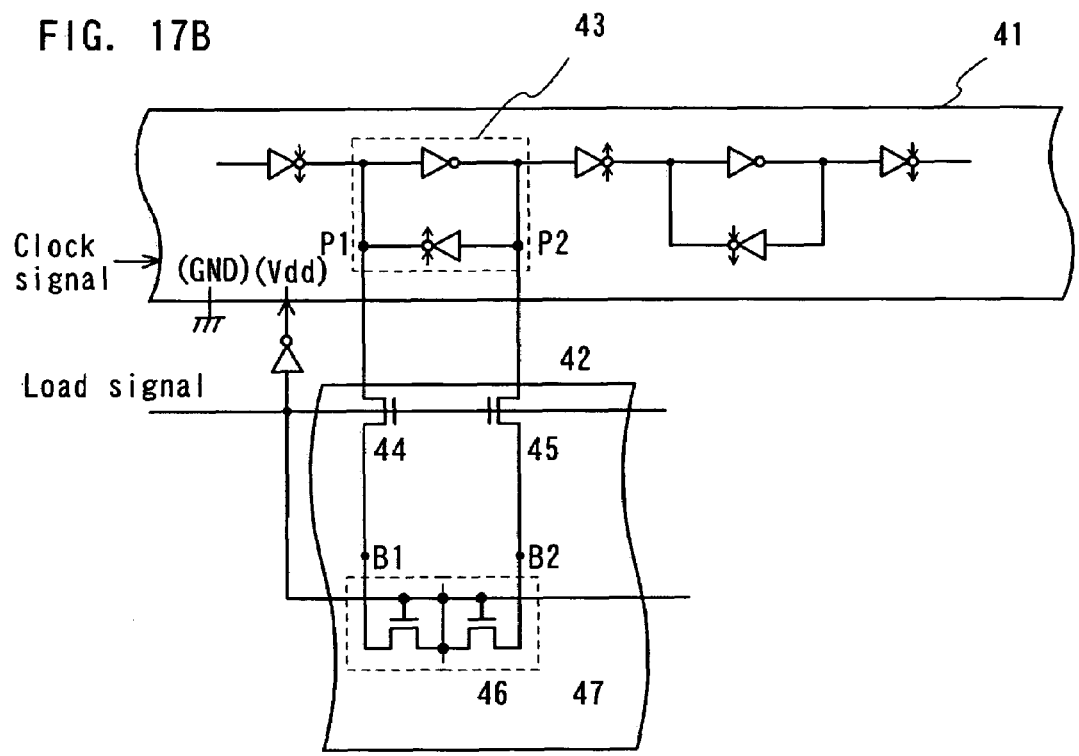
Figure 17C:
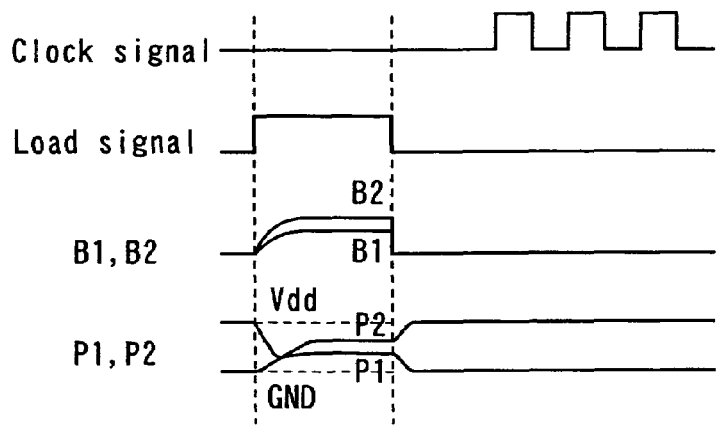

Such an example is described with reference to FIGS. 17A to 17C. FIG. 17A is a block diagram, FIG. 17B is a circuit diagram showing a part of FIG. 17A, and FIG. 17C is a timing chart. In FIG. 17A, a clock signal and a load signal are inputted to a shift register 41, and a load signal and an address signal are inputted to a random number ROM 42. In such a circuit, random number data is loaded from the random number ROM 42 to the shift register 41 by a load signal, then the random number data is outputted sequentially from the shift register 41 in accordance with a clock signal.

FIG. 17B shows a circuit configuration example that corresponds to a 1-bit random number of the block diagram shown in FIG. 17A. In FIG. 17B, the shift register 41 using a clocked inverter includes a flip-flop 43, and memory cells 46 and 47 are connected to each end of the flip-flop 43 through selecting TFTs 44 and 45.

FIG. 17C shows a timing chart. First, an initial value is loaded from the random number ROM 42 to the shift register 41 while interrupting a clock signal. When a load signal is asserted, a power source potential of the shift register 41 is grounded and data stored in the register is erased. At the same time, a random potential is outputted from the memory cells 46 and 47 to bit lines B1 and B2, and applied to each end P1 and P2 of the flip-flop 43 through the selecting TFTs 44 and 45, respectively. After that, when the load signal is deasserted, the selecting TFTs 44 and 45 are turned off, thereby the shift register 41 and the memory cells 46 and 47 are disconnected. At this time, the flip-flop 43 stores data having as the initial value an analog potential applied by the memory cells 46 and 47, thus loading of random numbers to the shift register 41 is completed. Then, chip-specific data is outputted sequentially by operating the clock signal.

In this manner, a simple circuit configuration that has a function to store and read specific data of an ID chip can be achieved.

Figure 18:
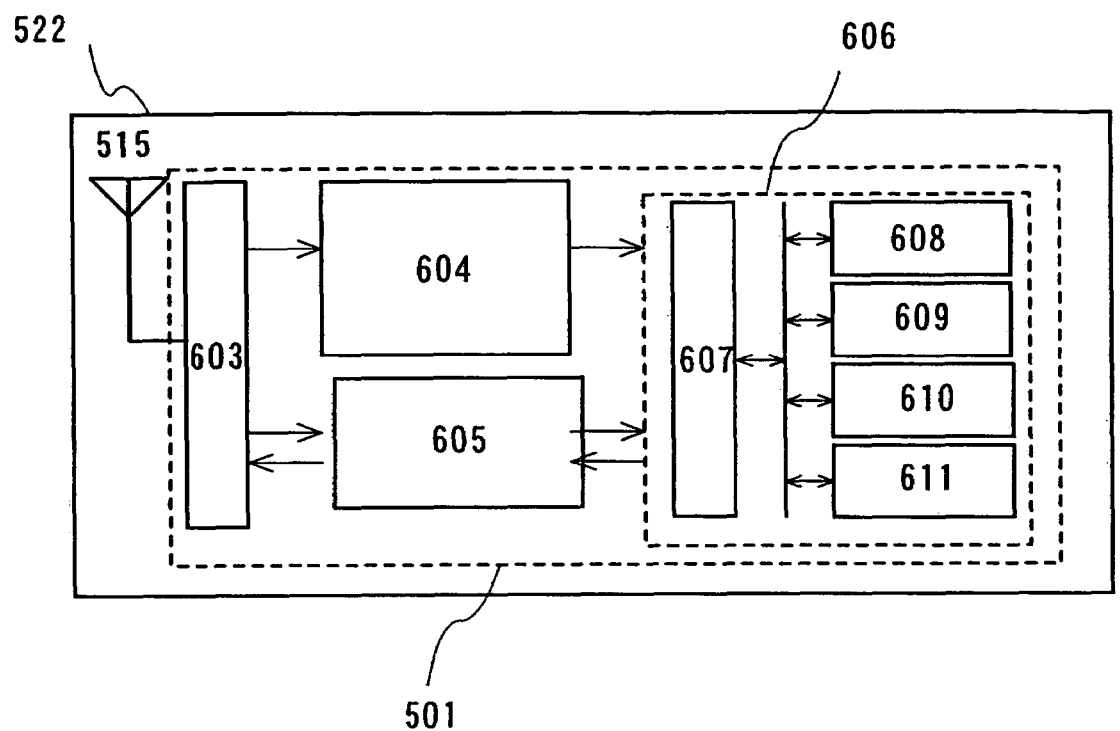
FIG. 18 is a diagram showing a circuit configuration of an ID chip.

The ID chip can also be used as a high performance circuit having a logic portion including a CPU as shown in FIG. 18.

FIG. 18 shows an ID chip 522 that includes the antenna 515, an RF circuit 603, a power source/clock signal/reset signal generating circuit 604, a data demodulation/modulation circuit 605, and a logic portion 606. The logic portion 606 includes a control circuit 607, a CPU 608, a program ROM 609, a work RAM 610, and a random number ROM 611.

The circuits, ROMs and RAM shown in FIG. 18 can be integrally formed on an insulating surface as the thin film integrated circuit 501. The substrate having an insulating surface can be formed with reference to the aforementioned embodiment mode. Similarly to the aforementioned embodiment mode, the antenna 515 can be formed over the thin film integrated circuit 501 on the insulating surface or formed over another substrate, namely an antenna substrate. In addition, this embodiment mode can be implemented in combination with the method of peeling off and transposing the thin film integrated circuit described in the aforementioned embodiment mode.

The ID chip 522 shown in FIG. 18 can have various functions when the CPU 608 executes and processes program stored in the program ROM 609, as well as a function to read an identification number assigned to the ID chip.

Typically, the ID chip 522 can incorporate a security function such as verification of passwords, management of access to each segment of a memory, and encryption/decryption processing. Further, the ID chip 522 may include a dedicated hardware for increased processing speed of complex encryption/decryption.

When such a complex thin film integrated circuit is formed on a silicon wafer, a circuit area is increased and impact resistance is decreased. On the other hand, being formed on a flexible substrate, the ID chip of the invention can provide increased impact resistance even when a circuit area is increased to some extent.

This application is based on Japanese Patent Application serial No. 2003-432343 filed in Japan Patent Office on Dec. 26, 2003, and Japanese Patent Application Ser. No. 2004-030976 filed in Japan Patent Office on Feb. 6, 2004, the contents of which are hereby incorporated by reference.

What is claimed is:

1. A chip comprising:
    an integrated circuit including;
    a memory cell including a semiconductor film with a thickness of 0.2 μm or less;
    a first wiring over the semiconductor film; and
    a second wiring over the semiconductor film,
    wherein the semiconductor film is connected to one of the first wiring and the second wiring by disconnecting the other of the first wiring and the second wiring with laser cutting to input data to the memory cell.

2. The chip according to claim 1, wherein the semiconductor film is formed on an insulating surface over a substrate selected from the group consisting of a glass substrate, a quartz substrate, a stainless substrate, and a flexible substrate formed of a synthetic resin.

3. The chip according to claim 1, wherein the integrated circuit comprises a thin film transistor including the semiconductor film.

4. A chip comprising:
    an integrated circuit including;
    a non-volatile and non-rewritable memory cell including a semiconductor film with a thickness of 0.2 μm or less;
    a first wiring over the semiconductor film; and
    a second wiring over the semiconductor film,
    wherein the semiconductor film is connected to one of the first wiring and the second wiring by disconnecting the other of the first wiring and the second wiring with laser cutting to input data to the non-volatile and non-rewritable memory cell, and wherein the integrated circuit comprises the non-volatile and non-rewritable memory cell that stores the data based on variations in characteristics of the semiconductor film.

5. The chip according to claim 4, wherein the semiconductor film is formed of a crystalline semiconductor film.

6. The chip according to claim 4, wherein the semiconductor film is formed on an insulating surface over a substrate selected from the group consisting of a glass substrate, a quartz substrate, a stainless substrate, and a flexible substrate formed of a synthetic resin.

7. The chip according to claim 4, wherein the integrated circuit comprises a thin film transistor including the semiconductor film.

8. A chip mounting product comprising:
an integrated circuit including;
a memory cell including a semiconductor film with a thickness of 0.2 μm or less;
a first wiring over the semiconductor film; and
a second wiring over the semiconductor film,
wherein the semiconductor film is connected to one of the first wiring and the second wiring by disconnecting the other of the first wiring and the second wiring with laser cutting to input data to the memory cell.

9. The chip mounting product according to claim 8, wherein the semiconductor film is formed on an insulating surface over a substrate selected from the group consisting of a glass substrate, a quartz substrate, a stainless substrate, and a flexible substrate formed of a synthetic resin.

10. The chip mounting product according to claim 8, wherein the integrated circuit comprises a thin film transistor including the semiconductor film.

11. A chip mounting product comprising:
an integrated circuit including;
a non-volatile and non-rewritable memory cell including a semiconductor film with a thickness of 0.2 μm or less;
a first wiring over the semiconductor film; and
a second wiring over the semiconductor film,
wherein the semiconductor film is connected to one of the first wiring and the second wiring by disconnecting the other of the first wiring and the second wiring with laser cutting to input data to the non-volatile and non-rewritable memory cell, and
wherein the integrated circuit comprises the non-volatile and non-rewritable memory cell that stores the data based on variations in characteristics of the semiconductor film.

12. The chip mounting product according to claim 11, wherein the semiconductor film is formed of a crystalline semiconductor film.

13. The chip mounting product according to claim 11, wherein the semiconductor film is formed over an insulating surface of a substrate selected from the group consisting of a glass substrate, a quartz substrate, a stainless substrate, and a flexible substrate formed of a synthetic resin.

14. The chip mounting product according to claim 11, wherein the integrated circuit comprises a thin film transistor including the semiconductor film.

15. A manufacturing method of a chip, comprising:
forming a semiconductor film with a thickness of 0.2 μm or less;
crystallizing the semiconductor film to form a crystalline semiconductor film;
forming a first wiring over the crystalline semiconductor film by photolithography;
forming a second wiring and a third wiring over the crystalline semiconductor film;
forming an integrated circuit by forming a first memory cell and a second memory cell, wherein the first memory cell includes the first wiring and a first part of the crystalline semiconductor film, and wherein the second memory cell includes the second wiring, the third wiring and a second part of the crystalline semiconductor film; and
cutting one of the second wiring and the third wiring with laser to input data to the second memory cell,
wherein the first memory cell is selected by a circuit connection obtained by the first wiring.

16. The manufacturing method of a chip, according to claim 15,
wherein an antenna electrically connected to the integrated circuit is formed.

17. The manufacturing method of a chip, according to claim 16,
wherein the antenna is formed symmetrically with the integrated circuit interposed therebetween.

18. The manufacturing method of chip, according to claim 16,
wherein the antenna is formed over a second substrate;
wherein the second substrate is folded so as to interpose the integrated circuit; and
wherein the antenna is formed symmetrically with the integrated circuit interposed therebetween.

19. A manufacturing method of a chip mounting product, comprising:
forming a semiconductor film with a thickness of 0.2 μm or less;
crystallizing the semiconductor film to form a crystalline semiconductor film;
forming a first wiring over the crystalline semiconductor film by photolithography;
forming a second wiring and a third wiring over the crystalline semiconductor film;
forming an integrated circuit by forming a first memory cell having a circuit connection obtained by the first wiring and by forming a second memory cell having a circuit connection by the second wiring and the third wiring formed over the crystalline semiconductor film by droplet ejection; and
cutting one of the second wiring and the third wiring with laser to input data to the second memory cell.

20. The manufacturing method of a chip mounting product, according to claim 19,
wherein an antenna electrically connected to the integrated circuit is formed.

21. The manufacturing method of a chip mounting product, according to claim 20,
wherein the antenna is formed symmetrically with the integrated circuit interposed therebetween.

22. The manufacturing method of a chip mounting product, according to claim 20,
wherein the antenna is formed over a second substrate; and
wherein the second substrate is folded so as to interpose the integrated circuit and the antenna is formed symmetrically with the integrated circuit interposed therebetween.

* * * * *